United States Patent
Ohuchi

(10) Patent No.: US 6,975,036 B2
(45) Date of Patent: Dec. 13, 2005

(54) FLIP-CHIP SEMICONDUCTOR DEVICE UTILIZING AN ELONGATED TIP BUMP

(75) Inventor: Rieka Ohuchi, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 10/403,036

(22) Filed: Apr. 1, 2003

(65) Prior Publication Data

US 2003/0183947 A1 Oct. 2, 2003

(30) Foreign Application Priority Data

Apr. 1, 2002 (JP) .................................. 2002-098699

(51) Int. Cl.$^7$ .................. H01L 23/48; H01L 21/44; B23K 31/00
(52) U.S. Cl. .............. 257/778; 257/779; 257/783; 228/180.22; 438/108
(58) Field of Search .............. 29/874, 876, 884; 228/178, 179.1, 180.1, 180.21, 180.22, 180.5; 257/738, 778, 779, 780, 782–784; 438/108, 612, 613

(56) References Cited

U.S. PATENT DOCUMENTS

| | | | |
|---|---|---|---|
| 5,371,328 A | * | 12/1994 | Gutierrez et al. ............ 174/261 |
| 6,271,107 B1 | * | 8/2001 | Massingill et al. ......... 438/597 |
| 6,590,293 B2 | * | 7/2003 | Onishi et al. ................ 257/780 |
| 6,780,668 B1 | * | 8/2004 | Tsukahara et al. .......... 438/106 |

FOREIGN PATENT DOCUMENTS

| | | | | |
|---|---|---|---|---|
| JP | 06-177214 A | 6/1994 | | |
| JP | 09-97815 A | 4/1997 | | |
| JP | 09172021 A | * 6/1997 | .......... H01L/21/321 |
| JP | 09-237806 A | 9/1997 | | |
| JP | 10-079362 A | 3/1998 | | |
| JP | 11-274241 A | 10/1999 | | |
| JP | 11-297750 A | 10/1999 | | |
| JP | 2000227952 A | * 8/2000 | .......... G06K/19/07 |
| JP | 2000-286302 A | 10/2000 | | |
| JP | 2001-127395 A | 5/2001 | | |
| JP | 2001-237274 A | 8/2001 | | |
| JP | 2001-308140 A | 11/2001 | | |
| JP | 2002-016022 A | 1/2002 | | |
| JP | 2002-033343 A | 1/2002 | | |

* cited by examiner

Primary Examiner—Alonzo Chambliss
(74) Attorney, Agent, or Firm—Sughrue Mion, PLLC

(57) ABSTRACT

A flip-chip type semiconductor device includes a semiconductor chip having electrode pads formed and arranged on a chip surface thereof. Sprout-shaped metal bumps are bonded to the electrode pads on the chip, and an adhesive resin layer is formed on the chip surface of the chip such that tip ends of the sprout-shaped metal bumps are protruded from the adhesive resin layer. A circumference of the tip end of each sprout-shaped metal bump is surrounded by a protective resin material integrally swelled from the adhesive rein layer such that a tip end face of each sprout-shaped metal bump is at least exposed to the outside.

7 Claims, 20 Drawing Sheets

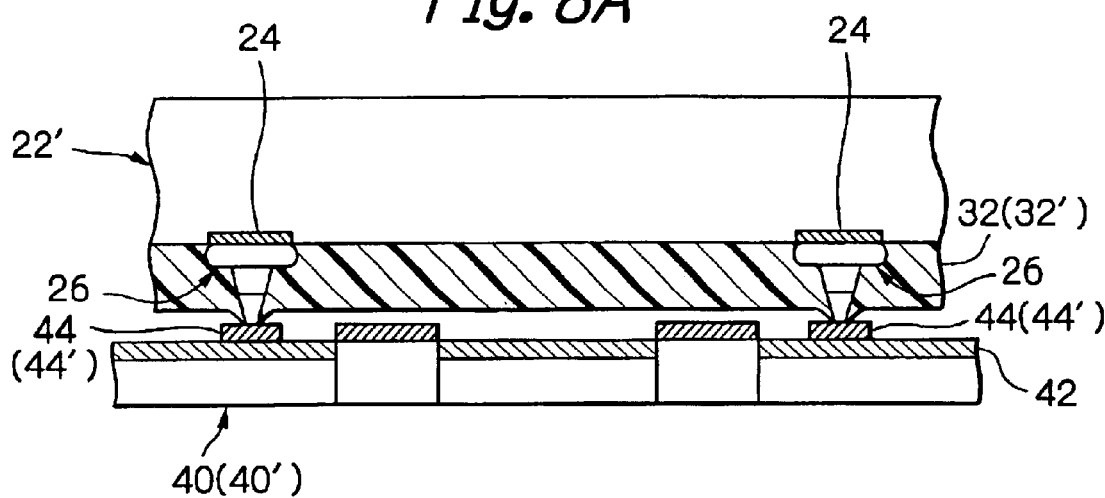
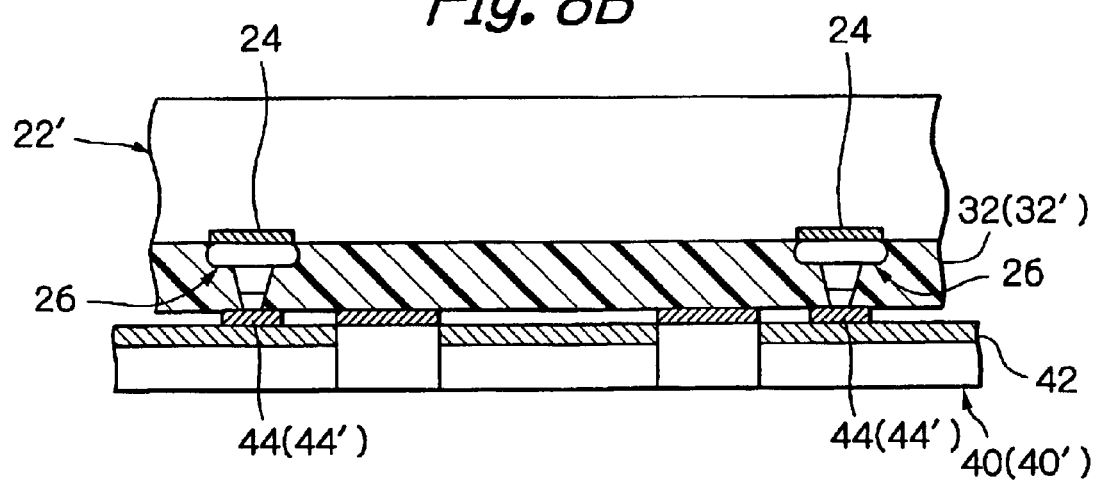
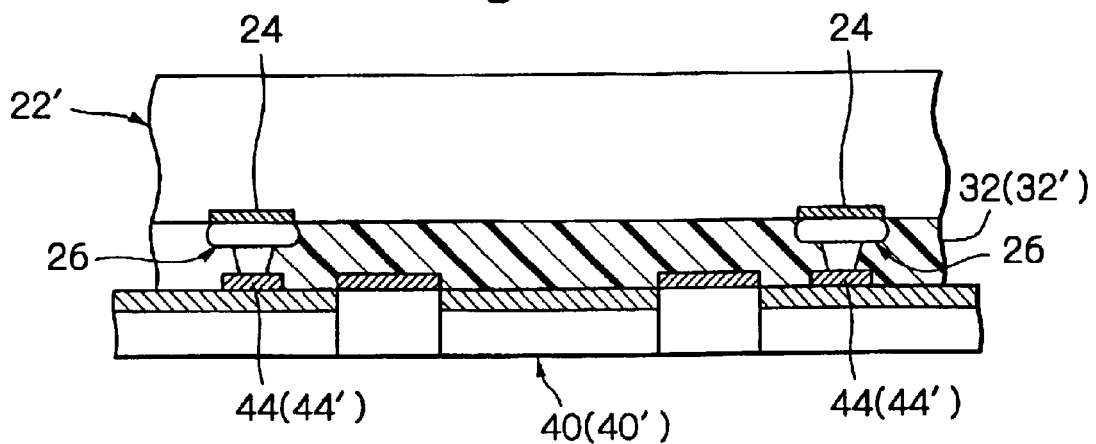

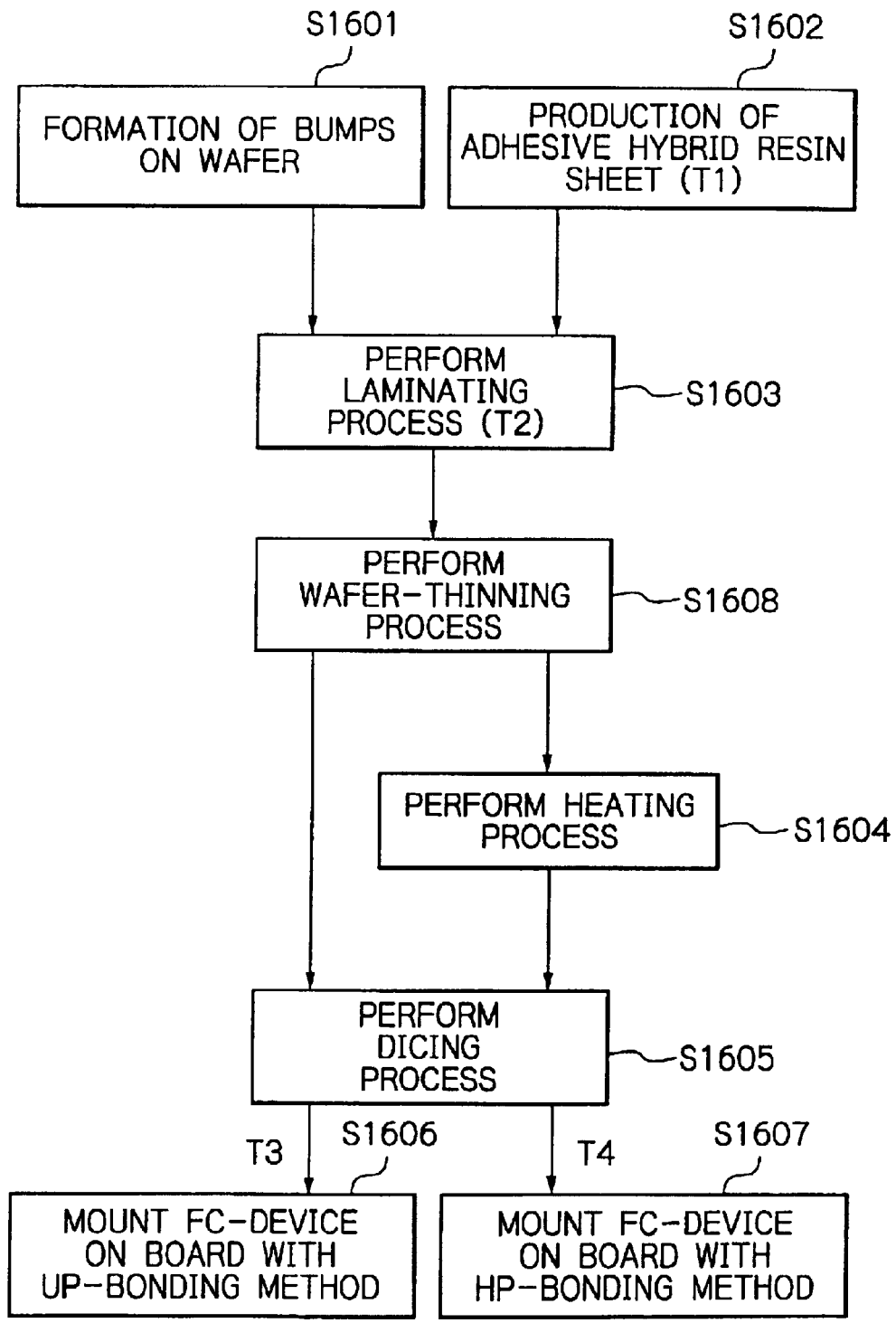

FLIP-CHIP SEMICONDUCTOR DEVICE UTILIZING AN ELONGATED TIP BUMP

BACKGROUND OF THE INVENTION

1. Field of the Invention

The present invention relates to a flip-chip type semiconductor device, a process for manufacturing such a flip-chip type semiconductor device, and a process for mounting such a flip-chip type semiconductor device on a wiring-board.

2. Description of the Related Art

A flip-chip (FC) type semiconductor device has been developed to meet the demands of higher performance, is smaller and lighter size, and higher speed for a piece of electronic equipment. Generally, the FC type semiconductor device has a plurality of electrode pads arranged on a semiconductor chip (i.e. bare chip), and a plurality of metal bumps bonded to the electrode pads. Each of the metal bumps may be formed of solder or gold, and serves as an electrode terminal or lead.

The FC type semiconductor device is frequently assembled in a BGA (ball grid array) type package, which includes a wiring-board, usually called a package board or interposer. The wiring-board has a plurality of electrode pads arranged on a lower or bottom surface thereof, and a plurality of solder balls bonded to the electrode pads, with the solder balls forming the ball grid array (BGA).

In the BGA type package, the FC type semiconductor device is mounted on an upper or top surface of the wiring-board, such that the respective metal bumps of the FC type semiconductor device are correspondingly contacted with and bonded to electrode pads formed and arranged on the upper surface of the wiring-board.

In particular, there is a mirror image relationship between the arrangement of electrode pads of the FC type semiconductor device and the arrangement of electrode pads of the wiring-board. Thus, when the FC type semiconductor device is flipped over and put in place on the upper surface of the wiring-board, the respective electrode pads of the FC type semiconductor device are electrically connected to the electrode pads of the wiring-board through the intermediary of the metal bumps. Then, the respective metal bumps of the FC type semiconductor device are securely bonded to the electrode pads on the wiring-board by either an ultrasonic-pressure bonding method or a heat-pressure bonding method.

After the metal bumps are bonded to the electrode pads, a resin-underfilling process is performed such that the space between the FC type semiconductor device and the wiring-board is filled with a suitable resin, to thereby seal the arrangement of metal bumps, resulting in production of the BGA type package.

On the other hand, the FC type semiconductor device may be directly mounted on a motherboard for a piece of electronic equipment, such that the respective metal bumps of the FC type semiconductor device are contacted with and bonded to electrode pads formed and arranged on the motherboard. Similarly, after the metal bumps are bonded to the electrode pads, the resin-underfilling process is performed such that the space between the FC type semiconductor device and the motherboard is filled with a suitable resin to seal the arrangement of metal bumps.

In either case, it is troublesome to perform the resin-underfilling process, because the space between the FC type semiconductor device and the wiring-board or motherboard is very narrow. Namely, it is hard to introduce the resin into the narrow space between the FC type semiconductor device and the wiring-board or motherboard.

Conventionally, in order to omit the troublesome resin-underfilling process, it has been proposed that an adhesive resin layer is previously provided on either the FC type semiconductor device or the wiring-board before the FC type semiconductor device is mounted on the wiring-board, as shown in, for example, Japanese Laid-Open Patent Publications (KOKAI) No. HEI-09-097815, No. HEI-11-274241, No. HEI-11-297750, No. 2000-286302, No. 2001-127395, No. 2001-237274, and No. 2001-308140.

Frequently, each of the metal bumps is formed as a sprout-shaped bump. In this case, when the adhesive resin layer is formed on the surface of the FC type semiconductor device on which the sprout-shaped bumps are arranged and bonded, tip ends of the sprout-shaped bumps are protruded from a surface of the adhesive resin layer so as to be exposed to the exterior.

Then, the FC type semiconductor device is flipped over and put in place on the wiring-board or motherboard, the respective electrode pads of the FC type semiconductor device are electrically connected to the electrode pads of the wiring-board through the intermediary of the sprout-shaped bumps, with the adhesive resin layer being intervened between the FC type semiconductor device and the wiring-board. Subsequently, the respective sprout-shaped bumps are securely bonded to the electrode pads of the wiring-board by either the ultrasonic-pressure bonding method or the heat-pressure bonding method. When the bonding of the sprout-shaped bumps to the electrode pads is completed, the adhesive resin layer is adhered to the wiring-board or motherboard, and thus the arrangement of sprout-shaped bumps is sealed by the adhesive resin layer.

Nevertheless, it is hard to handle the FC type semiconductor device with the adhesive resin layer, because the exposed tip ends of the sprout-shaped bumps are very susceptible to damage and injury, resulting in a lowering of production efficiency of FC type semiconductor devices. Also, the adhesive resin layer is liable to be deteriorated for the reasons involved in a process for the formation of the adhesive resin layer, as stated hereinafter.

SUMMARY OF THE INVENTION

Therefore, a main object of the present invention is to provide a flip-chip type semiconductor device comprising a semiconductor chip, a plurality of sprout-shaped bumps arranged on the semiconductor chip, and an adhesive resin layer previously formed on the semiconductor chip to seal the arrangement of sprout-shaped bumps, which device is constituted so as to be easy handled.

Another object of the present invention is to provide the above-mentioned flip-chip type semiconductor device in which the adhesive resin layer can be formed without being subjected to deterioration.

Yet another object of the present invention is to provide the above-mentioned flip-chip type semiconductor device, a whole thickness of which can be made to be smaller.

Still yet another object of the present invention is to provide a process for manufacturing the above-mentioned flip-chip type semiconductor device.

Still yet another object of the present invention is to provide a process for mounting the above-mentioned flip-chip type semiconductor device.

In accordance with a first aspect of the present invention, there is provided a flip-chip type semiconductor device comprising a semiconductor chip having a plurality of electrode pads formed and arranged on a chip surface thereof; a plurality of sprout-shaped metal bumps bonded to the electrode pads of the semiconductor chip, and an adhesive resin layer formed on the chip surface of the semiconductor chip such that tip ends of the sprout-shaped metal bumps are protruded from the adhesive resin layer. A circumference of the tip end of each sprout-shaped metal bump is surrounded by a protective resin material integrally swelled from the adhesive rein layer such that a tip end face of each sprout-shaped metal bump is at least exposed to the outside.

The protective resin material may be configured such that a tip-endmost portion of each sprout-shaped metal bump is exposed to the outside. The sprout-shaped metal bumps is made of a suitable metal material, such as gold, solder, and silver.

The adhesive resin layer may be composed of a thermoplastic resin component and a solvent component, and a state of the adhesive resin layer is controlled by regulating an amount of the solvent component and a temperature, such that the semiconductor device is properly mounted on an electronic board by a previously-decided bonding method.

Also, the adhesive resin layer may be formed of a hybrid resin composed of a thermoplastic resin component and a thermosetting resin component, whereby a state of the adhesive resin layer is controlled by regulating a temperature and a setting degree of the thermosetting resin component, such that the semiconductor device is properly mounted on an electronic board by a previously-decided bonding method.

In accordance with a second aspect of the present invention, there is provided a manufacturing process for manufacturing a flip-chip type semiconductor device, which comprises steps of: preparing a semiconductor chip having a plurality of sprout-shape metal bumps provided on a chip surface thereof; preparing an adhesive resin sheet constituted from a film-like resin support element, and an adhesive resin layer formed on the film-like resin support element and having a thickness less than a height of the sprout-shaped metal bumps; and laminating the adhesive resin sheet on the chip surface of the semiconductor chip such that tip ends of the sprout-shaped metal bumps penetrate through the adhesive resin layer, and engage with the film-like resin support element such that a depression is formed in the film-like resin support element by the tip end of each sprout-shaped metal bump under a temperature at which the adhesive resin layer is fluidified, and which is higher than a glass transition temperature of the film-like resin support element, whereby a resin material forming the adhesive resin layer is introduced into the depressions.

The film-like resin support element may pierced by a tip-endmost of each sprout-shaped metal bump at a bottom face of the depression.

The manufacturing process may further comprise a step of thinning a thickness of the semiconductor chip under a low temperature lower at which the adhesive resin layer is solidified. Also, the manufacturing process further comprises a step of removing the film-like resin support element from the laminated adhesive resin sheet, whereby a circumference of the tip end of each sprout-shaped metal bump is surrounded by a protective resin material derived from the introduction of the resin material into the depressions, with a tip end face of each sprout-shaped metal bump being at least exposed to the outside.

In accordance with a third aspect of the present invention, there is provided a manufacturing process for manufacturing flip-chip type semiconductor devices, which comprises steps of: preparing a wafer having a plurality of semiconductor chip areas defined thereon, each semiconductor chip area having a plurality of sprout-shape metal bumps provided on a chip surface thereof; preparing an adhesive resin sheet constituted from a film-like resin support element, and an adhesive resin layer formed on the film-like resin support element and having a thickness less than a height of the sprout-shaped metal bumps; and laminating the adhesive resin sheet on the chip surfaces of the wafer such that tip ends of the sprout-shaped metal bumps penetrate through the adhesive resin layer, and engage with the film-like resin support element such that a depression is formed in the film-like resin support element by the tip end of each sprout-shaped metal bump under a temperature at which the adhesive resin layer is fluidified, and which is higher than a glass transition temperature of the film-like resin support element, whereby a resin material forming the adhesive resin layer is introduced into the depressions.

In the third aspect of the present invention, the manufacturing process may further comprise a step of dicing the wafer such that each semiconductor chip area is produced as a flip-chip type semiconductor device. The dicing step may be performed either after the laminating step or before the laminating step. Also, the film-like resin support element is pierced by a tip-endmost of each sprout-shaped metal bump at a bottom face of the depression.

In accordance with a fourth aspect of the present invention, there is provided a mounting process for mounting the flip-chip type semiconductor device on an electronic board, which comprises steps of: controlling a state of the adhesive resin layer according to a previously-decided bonding method; and bonding the sprout-shaped metal bumps of the flip-chip type semiconductor to electrode pads formed on the electronic board, using the previously-decided bonding method, whereby the mounting of the flip-chip type semiconductor device on the electronic board is properly and successfully performed.

In the mounting process, when the adhesive resin layer is composed of a thermoplastic resin component and a solvent component, the control of the state of the adhesive resin layer is performed by regulating an amount of the solvent component and a temperature. Also, when the adhesive resin layer is formed of a hybrid resin composed of a thermoplastic resin component and a thermosetting resin component, the control of the state of the adhesive resin layer is performed by regulating a temperature and a setting degree of the thermosetting resin component, such that the semiconductor device is properly mounted on an electronic board by a previously-decided bonding method.

BRIEF DESCRIPTION OF THE DRAWINGS

The above objects and other objects will be more clearly understood from the description set forth below, with reference to the accompanying drawings, wherein:

FIG. 8A is a partial cross-sectional side view of a wiring-board, on which a flip-chip type semiconductor device is put in place, showing a first representative stage of a process for mounting the flip-chip type semiconductor device on the wiring-board;

FIG. 8B is a partial cross-sectional side view, similar to FIG. 8A, showing a second representative stage of the mounting process;

FIG. 8C is a partial cross-sectional side view, similar to FIG. 8B, showing a third representative stage of the mounting process;

FIG. 21 is a flowchart of a fourth embodiment of the manufacturing process, including the mounting process, according to the present invention.

DESCRIPTION OF THE PREFERRED EMBODIMENTS

Before descriptions of embodiments of the present invention, for better understanding of the present invention, a representative conventional process for manufacturing flip-chip type semiconductor devices will be explained with reference to FIGS. 1 and 2.

Figure 1:
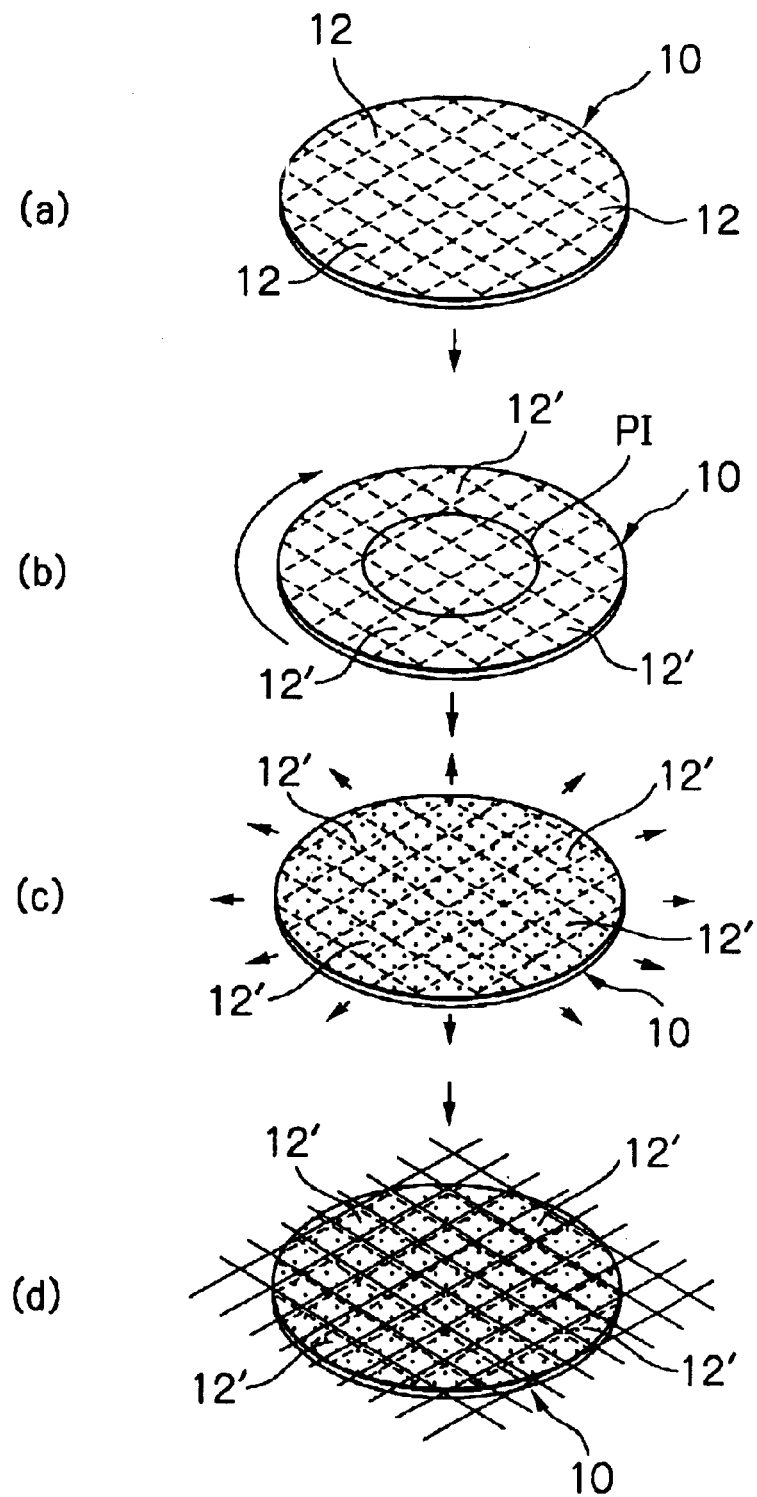
FIGS. 1(a)–(d) are an explanatory view conceptually showing representative four stages of a conventional process for manufacturing flip-chip type semiconductor devices from a silicon wafer.

As shown in FIG. 1, the conventional manufacturing process features representative four stages, indicated by references (a), (b), (c), and (d), respectively.

Figure 2A:
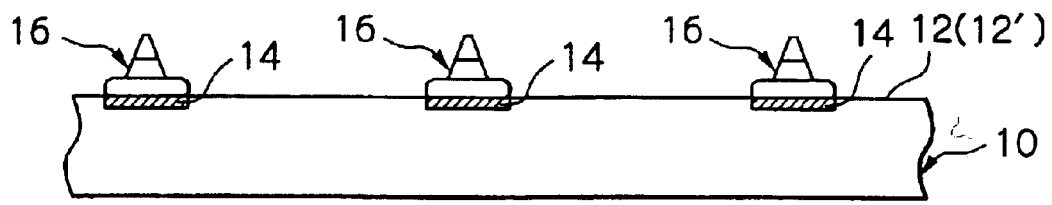
FIG. 2A is a partial cross-sectional side view of the silicon wafer on which the flip-chip type semiconductor devices are produced at a first stage of the conventional manufacturing process.

At the first stage (a), a silicon wafer 10 is prepared, and a surface of the silicon wafer 10 is sectioned into a plurality of semiconductor chip areas 12 by forming grid-like fine grooves in the silicon wafer 10. Namely, the semiconductor chip areas 12 are defined by the grid-like fine grooves, as conceptually shown in the first stage (a) of FIG. 1. Then, as shown in FIG. 2A, a plurality of aluminum electrode pads 14 is formed and arranged on each of the semiconductor chip area 12, and respective metal bumps 16 are bonded to the electrode pads 14.

In this example, each of the metal bumps 16 is formed as a sprout-shaped gold bump, using a wire-bonding machine. In particular, as well known, the wire-bonding machine has a movable capillary tube, through which a fine gold wire passes. A leading or free end of the gold wire, which is protruded from a tip of the capillary tube, terminates at a fine small bead, by which a withdrawal of the gold wire into the capillary tube is prevented. Also, the capillary tube is provided with a needle-like electrode, which is called a torch, and the needle-like electrode is beside the tip of the capillary tube.

For the formation of a sprout-shaped bump 16, the to movable capillary tube is moved such that the small bead is pressed against an electrode pad 14 while being subjected to ultrasonic vibration, and the small bead is welded and bonded to the electrode pad 14 concerned, due to both the ultrasonic vibration and the pressure. Then, while the capillary tube is moved upward so as to draw the gold wire out of the capillary tube, a high voltage is applied to the needle-like electrode to produce a spark between the drawn gold wire and the needle-like electrode.

Thus, the fine gold wire is cut off by the spark, resulting in a formation of a sprout-shaped bump 16. Namely, the bonded small bead is left as the sprout-shaped bump 16 on the electrode pad 14 concerned. On the other hand, the cut-off end of the gold wire is fused due to the spark to thereby produce a fine small bead which is used for a next formation of a sprout-shaped bump 16.

As shown in FIG. 2A, the sprout-shaped bump 16 has a base portion bonded to an electrode pad 14, and a cone-like portion integrally protruded from the base portion. Note that the cone-like portion is usually called a tail. When the gold wire has a diameter of 25 $\mu$m, the base portion has a diameter in a range from approximately 80 $\mu$m to approximate 90 $\mu$m, and a height within a range from approximately 20 $\mu$m to approximately 30 $\mu$m, and the cone-like portion or tail has a length in a range from approximately 30 $\mu$m to approximately 40 $\mu$m.

In short, by forming and arranging the sprout-shaped bumps 16 on all the semiconductor chip areas 12 of the silicon wafer 10, each semiconductor chip area 12 is produced as a flip-chip (FC) type semiconductor device 12' (FIG. 2A). Then, the silicon wafer 10 having the arrangement of sprout-shaped bumps 16 is subjected to a spin-coat process, as shown in the second stage (b) of FIG. 1. Namely, a given amount of suitable liquid thermoplastic resin, for example, polyimide indicated by reference PI, is put on the surface of the silicon wafer 10, and then the silicon wafer 10 is spun as indicated by an arrow in the second stage (b) of FIG. 1. Thus, the liquid polyimide is spread out over the surface of silicon wafer 10, due to the centrifugal forces acting on the liquid polyimide, as indicated by radial arrows in the third stage (c) of FIG. 1. Namely, the surface of the silicon wafer 10 is coated with the liquid polyimide.

Figure 2B:
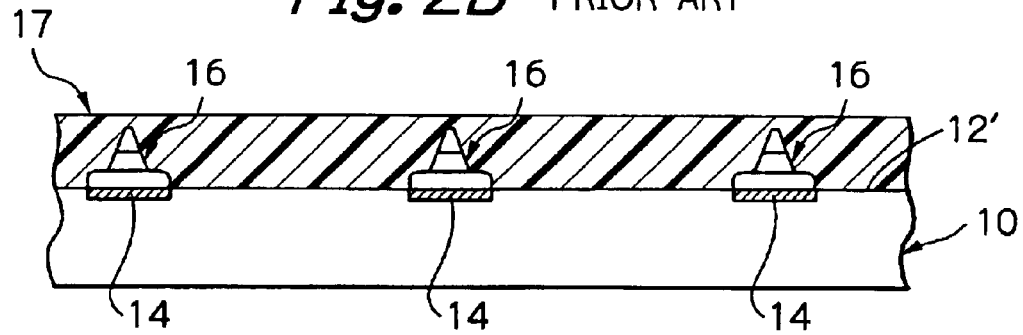
FIG. 2B is a partial cross-sectional side view of the silicon wafer, similar to FIG. 2A, on which an adhesive resin layer is formed at second and third stages of the conventional manufacturing process.

As soon as the spin-coat process is completed, the liquid polyimide is temperately hardened to a degree at which the polyimide cannot be fluidified, whereby an adhesive resin (polyimide) layer 17 is formed on the silicon wafer 10, as shown in FIG. 2B, with all the sprout-shaped bumps 16 being buried in the adhesive resin layer 17.

Figure 2C:
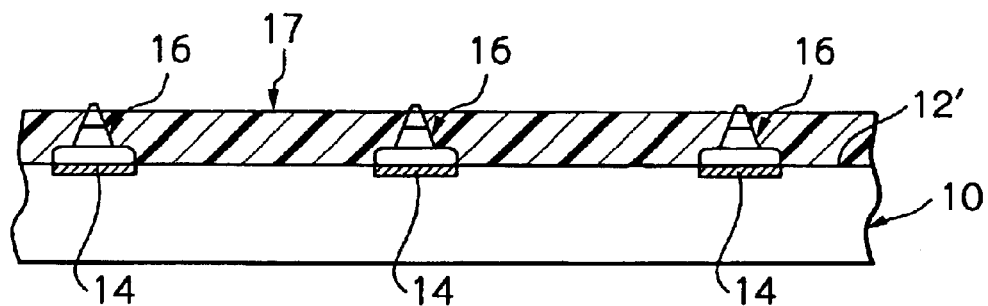
FIG. 2C is a partial cross-sectional side view of the silicon wafer, similar to FIG. 2B, on which the adhesive resin layer has been etched.

After the formation of the adhesive resin layer 17, the silicon wafer 10 is subjected to an etching process. Namely, a suitable etching solution containing potassium hydroxide (KOH), hydrazine ($N_2H_4$) or the like is prepared, and the adhesive resin layer 17 is immersed in the etching solution, whereby a thickness of the adhesive resin layer 17 is reduced such that tip ends of all the sprout-shaped bumps are protruded from the surface of the adhesive resin layer so as to be exposed to the exterior, as shown in FIG. 2C.

After the etching process, the silicon wafer 10 is subjected to a dicing process, as conceptually illustrated in the fourth stage (d) of FIG. 1. Namely, the silicon wafer 10 is cut along the grid-like grooves defining the FC type semiconductor devices 12', whereby the FC type semiconductor devices 12' are separated from each other.

Figure 3:
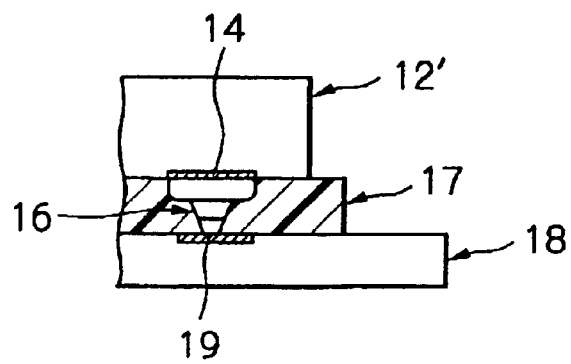
FIG. 3 is a partial cross-sectional side view for explaining a mounting process for mounting a flip-chip type semiconductor device on a wiring-board.

For example, as shown in FIG. 3, the separated FC type semiconductor device 12' is mounted on a wiring-board 18. A plurality of electrode pads 19 is formed and arranged on an upper or top surface of the wiring-board 18, and only one electrode pad 19 is representatively illustrated in FIG. 3. There is a mirror image relationship between the arrangement of electrode pads 14 of the semiconductor device 12' and the arrangement of electrode pads 19 of the wiring-board 18. Thus, when the semiconductor device 12' is flipped over and put in place on the upper surface of the wiring-board 18, the respective electrode pads 14 of the semiconductor device 12' are electrically connected to the electrode pads 19 of the wiring-board 18 through the sprout-shaped bumps 16.

Subsequently, the respective sprout-shaped bumps 16 of the FC type semiconductor device 12' are securely bonded to the electrode pads 19 on the wiring-board 18 by either an ultrasonic-pressure bonding method or a heat-pressure bonding method which is well known in this field. Namely, the tip end of each sprout-shaped bump 16 is squashed and bonded to the corresponding electrode pad 19, as shown in FIG. 3, and thus the adhesive resin layer 17 is contacted with the upper surface of the wiring-board 18. Thereafter, the adhesive resin layer 17 is completely hardened, and the arrangement of sprout-shaped bumps 16 are sealed by the hardened adhesive resin layer 17.

Although the mounting of the FC type semiconductor device 12' on the wiring-board 18 is achieved without the aforesaid resin-underfilling process, it is hard to handle the semiconductor device 12', because the exposed tip ends of the sprout-shaped bumps are very susceptible to damage and injury. Also, although the adhesive resin layer or polyimide layer 17 exhibits a high heat-resistance, it is liable to be deteriorated by the etching solution during the etching process.

Figure 4:
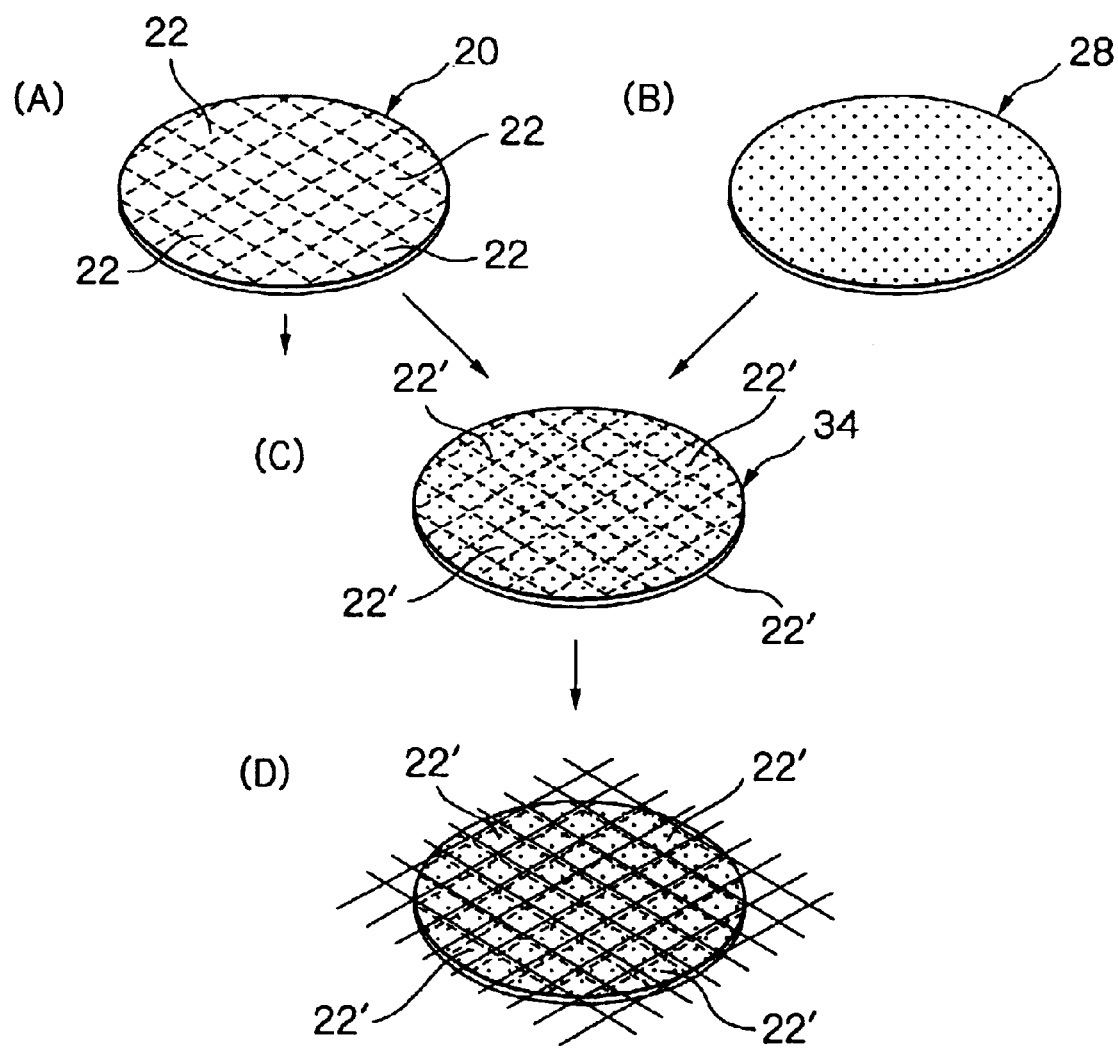
FIG. 4 is an explanatory view conceptually showing representative stages of a process for manufacturing flip-chip type semiconductor devices from a silicon wafer according to the present invention.

With reference to FIG. 4, a first embodiment of a process for manufacturing flip-chip type semiconductor devices according to the present invention is conceptually illustrated. As shown in this drawing, the manufacturing process features representative four stages, indicated by references (A), (B), (C), and (D), respectively.

Figure 5A:
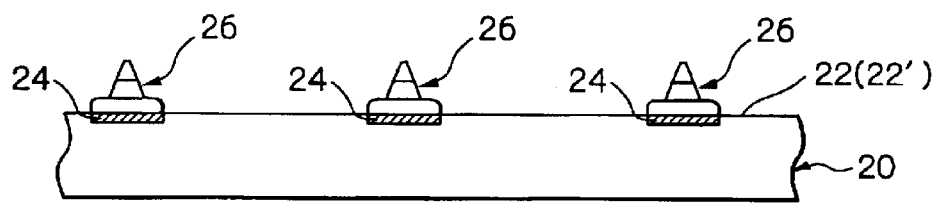
FIG. 5A is a partial cross-sectional side view of the silicon wafer on which the flip-chip type semiconductor devices are produced at a first stage of the manufacturing process according to the present invention.

Similar to the first stage (a) of FIG. 1, at the first stage (A), a silicon wafer 20 is prepared, and a plurality of semiconductor chip areas 22 are defined by grid-like fine grooves, as conceptually shown in the first stage (A) of FIG. 4. Then, as shown in FIG. 5A, a plurality of aluminum electrode pads 24 is formed and arranged on each of the semiconductor chip areas 22, and a plurality of electrode pads 24 is formed and arranged on each semiconductor chip area 22. Subsequently, respective sprout-shaped gold bumps 26 are formed and bonded to the electrode pads 24, using a wire-bonding machine, and thus each semiconductor chip area 22 is produced as a flip-chip (FC) type semiconductor device 22'. In short, the steps performed in the first stage (A) are substantially identical to those performed in the stage (a) of FIG. 1.

Note, a passivation layer, composed of either an organic material, such as polyimide or the like, or an inorganic material, such as phosphorous-silicate glass or the like, may be formed on an active area of the silicon wafer 20.

Figure 5B:
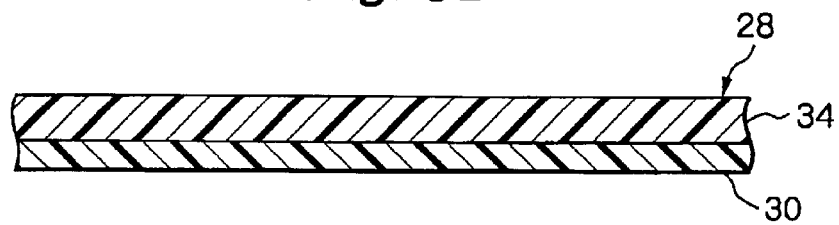
FIG. 5B is a partial cross-sectional side view of an adhesive resin sheet produced at a second stage of the manufacturing process according to the present invention.

On the other hand, at the second stage (B), an adhesive resin sheet 28, having substantially the same diameter as the silicon wafer 20, is produced. As shown in FIG. 5B, the adhesive resin sheet 28 is constituted from a film-like support element 30 made of a suitable resin, such as polyethylene terephthalate (PET) or the like, and an adhesive resin layer 32 formed on the film-like support element 30 and having a thickness less than a height of the sprout-shaped gold bumps 26. The formation of the adhesive resin layer 32 is performed by coating a surface of the film-like support element 30 with a fluid resin material which is composed of a suitable thermoplastic resin component and a suitable solvent component.

For example, in this embodiment, polyimide is used for the thermoplastic resin component, and triethylene glycol dimethylether is used for the solvent component. Since the triethylene glycol dimethylether has a boiling point of approximately 216° C. which is considerably higher than the ambient temperature, it cannot be easily evaporated under the ambient temperature. Thus, it is possible to easily control a fluidity of the adhesive resin layer 32 under the ambient temperature by adjusting an amount of the solvent component in the adhesive resin layer 32.

Figure 6:
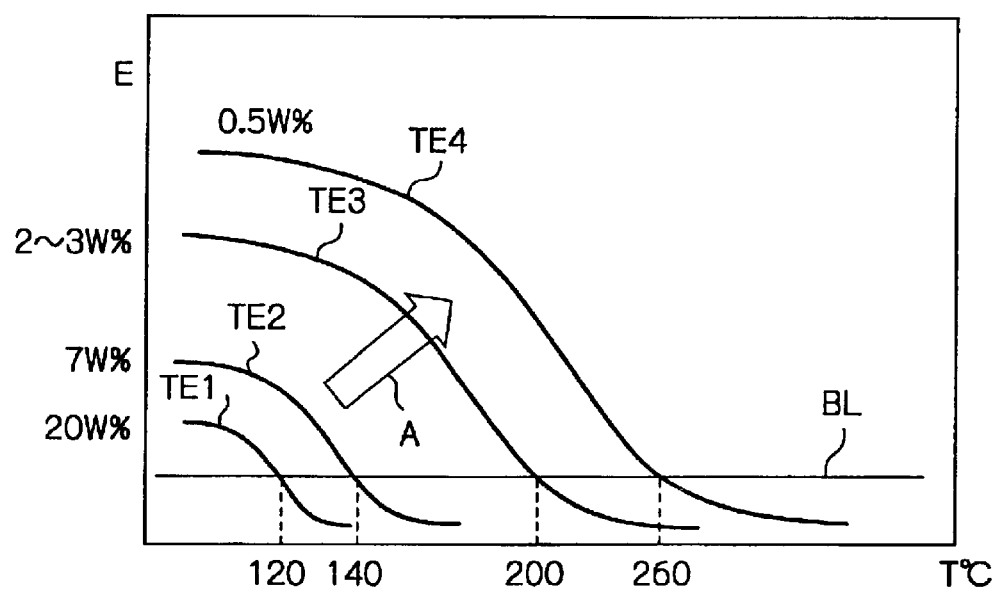
FIG. 6 is a graph showing a relationship between a temperature of an adhesive resin layer of the adhesive resin sheet and an elastic modulus of the adhesive resin layer.

In particular, with reference to a graph of FIG. 6, a relationship between a temperature (T° C.) of the adhesive resin layer 32 and an elastic modulus (E) of the adhesive resin layer 32 is shown. As shown in the graph of FIG. 6, when the adhesive resin layer 32 contains a 20 weight-percent (W %) solvent component, the T-E relationship is represented by a characteristic TE1; when the adhesive resin layer 32 contains a 7 W % solvent component, the T-E relationship is represented by a characteristic TE2; when the adhesive resin layer 32 contains a 2~3 W % solvent component, the T-E relationship is represented by a characteristic TE3; and when the adhesive resin layer 32 contains a 0.5 W % solvent component, the T-E relationship is represented by a characteristic TE4.

Also, in the graph of FIG. 6, reference BL indicates a boundary line representing whether or not the adhesive resin layer 32 can be fluidified. Namely, when the adhesive resin layer 32 containing the 20 W % solvent component is heated more than 120° C., it exhibits fluidity; when the adhesive resin layer 32 containing the 7 W % solvent component is heated more than 140° C., it exhibits fluidity; when the adhesive resin layer 32 containing the 2~3 W % solvent component is heated more than 200° C., it exhibits fluidity; and when the adhesive resin layer 32 containing the 0.5 W % solvent component is heated more than 260° C., it exhibits fluidity.

When the adhesive resin layer 32 is fluidified, it is impossible to measure an elastic modulus of the fluidified adhesive resin layer 32. Accordingly, although a state of the fluidified adhesive resin layer 32 should be evaluated by a viscosity of the fluidified adhesive resin layer 32, the ordinate of the graph of FIG. 6 represents the elastic modulus (E) for the sake of convenience. Namely, the state of the adhesive resin layer 32 not to be fluidified is represented by the elastic modulus (E) thereof.

As shown in the graph of FIG. 6, as the amount of the solvent component contained in the adhesive resin layer 32 is decreased, the characteristic (TE1, TE2, TE3, TE4) representing the T-E relationship is gradually shifted as indicated by an arrow A in FIG. 6, resulting in a rise in the filidifying temperature (120° C., 140° C., 200° C., 260° C.). The lesser the amount of the solvent component contained in the adhesive resin layer 32, i.e. the larger the elastic modulus (E) of the adhesive resin layer 32, the harder the adhesive resin layer 32.

Note, the fluidifying temperatures 120° C. and 140° C. participate in the first embodiment of the manufacturing process for the FC type semiconductor devices, and the fluidifying temperatures 200° C. and 260° C. participate in a process for mounting a manufactured FC type semiconductor device on either a wiring-board or a motherboard, as stated in detail hereinafter.

In short, at the second stage (B), the adhesive resin sheet 28 is produced by coating the surface of the film-like support element 30 with the resin, composed of the polyimide component and the 20 W % solvent component, which is heated to more than 120° C. Then, the adhesive resin sheet 28 is put in a suitable oven, and is heated such that the amount of solvent component, contained in the adhesive resin layer 32, is reduced from 20 W % to 7 W %. Thus, the T-E relationship on the adhesive resin layer 32 is represented by the characteristic TE2, as shown in the graph of FIG. 6.

Figure 5C:
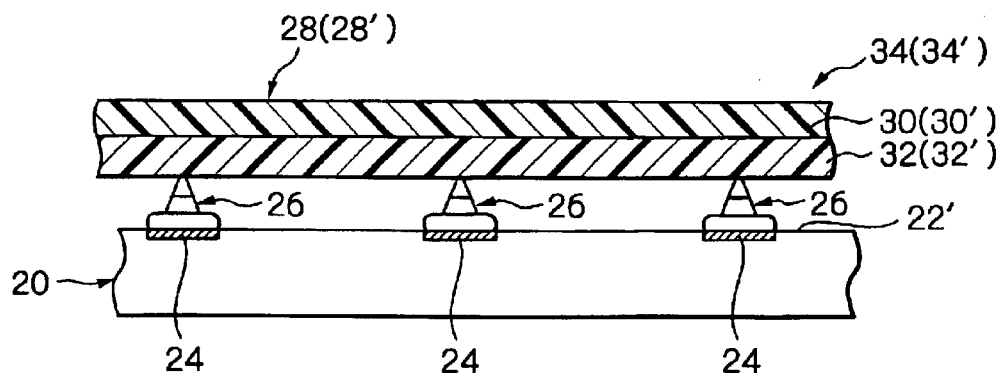
FIG. 5C is a partial cross-sectional side view of a provisional assembly formed from the silicon wafer with the arrangement of sprout-shaped gold bumps and the adhesive resin sheet shown in FIG. 5B.

At the third stage (C), the adhesive resin sheet 28 is placed on the silicon wafer 20 such that the surface of the adhesive resin layer 32 is opposed to the arrangement of sprout-shaped gold bumps 26 on the silicon wafer 20, as shown in FIG. 5C, resulting in production of a provisional assembly, generally indicated by reference 34 in FIG. 1 and FIG. 5C. Then, the provisional assembly 34 is subjected to a laminating process by a diaphragm type vacuum laminating machine, which is available from MEIKI SEISHAKUSHO K. K.

In particular, in the laminating process, first, the provisional assembly 34 is sandwiched by a carrier film and a cover film which are formed of a suitable resin, and is then fed to a vacuum chamber of the diaphragm type vacuum laminating machine. The vacuum chamber is provided with a diaphragm such that a part of the vacuum chamber is defined by the diaphragm, and the provisional assembly 34 is rested on the diaphragm, with it being sandwiched by the carrier and cover films.

In this embodiment, the provisional assembly 34 is heated in the vacuum chamber to 140° C. at which the adhesive resin layer 32 is fluidified, and the temperature of 140° C. is higher than a glass transition temperature (70~90° C.) of the polyethylene terephthalate (PET), which the film-like support element 30 is made of. Then, the vacuum chamber is evacuated such that a pressure within a range from 0.5 to 1.0 MPa is entirely and uniformly exerted on the provisional assembly 34, whereby the silicon wafer 20 and the adhesive resin sheet 28 are moved so as to be close to each other.

Figure 7A:
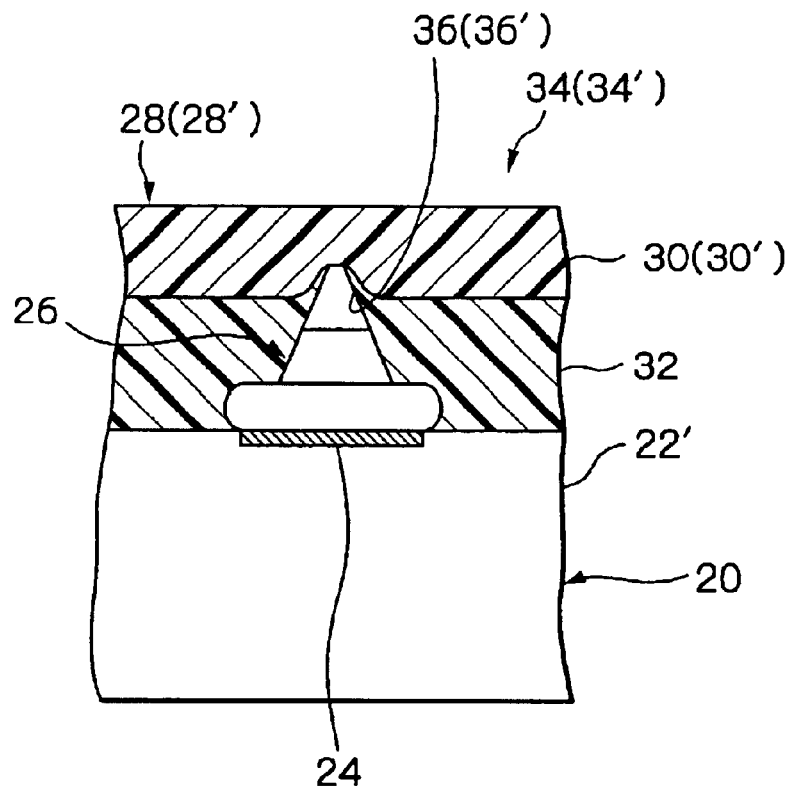
FIG. 7A is an enlarged partial cross-sectional side view of the provisional assembly while being subjected to a laminating process by a diaphragm type vacuum laminating machine.

Thus, although the sprout-shaped gold bumps 26 on the silicon wafer 10 are penetrated into the adhesive resin layer 32, each sprout-shaped gold bump 26 is not subjected to any deformation, as shown in FIG. 7A, because the adhesive resin layer 32 is heated to the fluidifying temperature of 140° C. (FIG. 6).

Also, as stated above, the thickness of the adhesive resin layer 32 is less than the height of the sprout-shaped gold bumps 26, and thus each sprout-shaped gold bump 26 passes through the adhesive resin layer 32 such that the tip end of each bump 26 is protruded from the surface of the adhesive resin layer 32 which is in contact with the film-like support element 30. Nevertheless, as shown in FIG. 7A, the protruded tip end of each bump 26 merely forms a depression 36 in the film-like support element 30 without the film-like support element 30 being pierced by the protruded tip end of each bump 26, because the film-like support element 30 is heated to 140° C. which is higher than the glass transition temperature (70~90° C.) of the polyethylene terephthalate. As is apparent from FIG. 7A, a part of the resin material forming the adhesive resin layer 32 is introduced into the depression 36, because the adhesive resin layer 32 is heated to the fluidifying temperature of 140° C., as already stated.

Figure 7B:
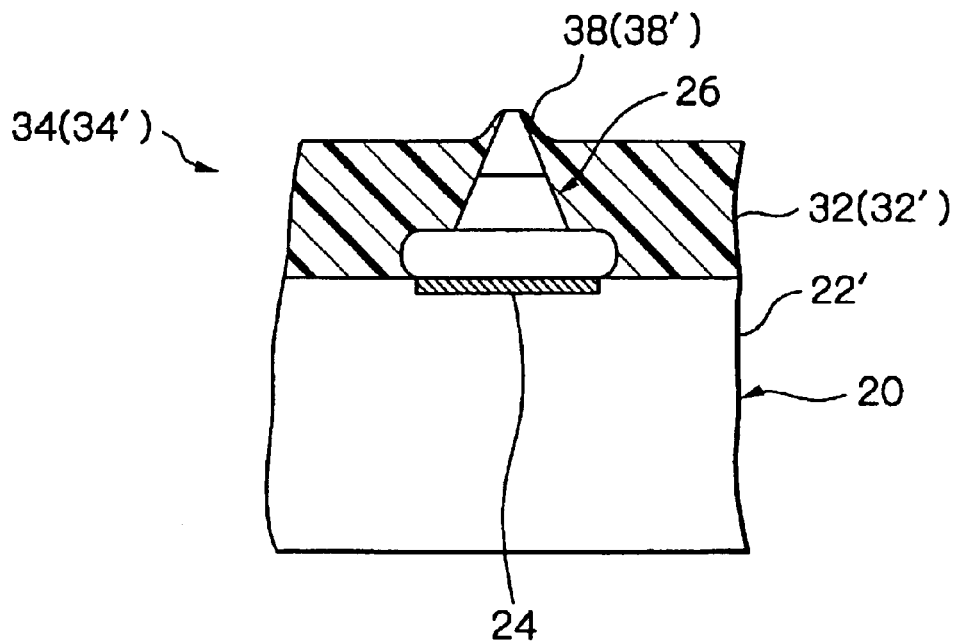
FIG. 7B is an enlarged partial cross-sectional side view, similar to FIG. 7A, with a film-like support element being removed from the assembly taken out of the diaphragm type vacuum laminating machine.

Thereafter, the assembly 34 is taken out of the diaphragm type vacuum laminating machine, and is put under the ambient temperature such that the adhesive resin layer 32 cannot be fluidified, i.e. it is solidified. Then, when the film-like support element 30 is removed from the assembly 34, as shown in FIG. 7B, the adhesive resin layer 32 is left on the silicon wafer 20. In other words, the adhesive resin layer 32 is transferred from the adhesive resin sheet 28 to the surface of the silicon wafer 20 on which the sprout-shaped gold bumps 26 are arranged.

After the transfer of the adhesive resin layer 32 from the adhesive resin sheet 28 to the silicon wafer 20, a dicing process is performed to cut the silicon wafer 20 along the grid-like grooves defining the FC type semiconductor devices 22', to thereby separate the FC type semiconductor devices 22' from each other, as conceptually illustrated in the fourth stage (D) of FIG. 4.

Although the separated semiconductor devices 22' may be shipped and circulated in an electronic market, it is easy to handle the FC type semiconductor devices 22', because the tip ends of the sprout-shaped bumps are not susceptible to damage and injury.

In particular, as is apparent from FIG. 7B, although the tip end face of each sprout-shaped gold bump 26 is exposed to the outside, a circumference of the tip end of each sprout-shaped gold bump 26 is surrounded by a cone-like protective resin material 38 which is derived from the introduction of the resin material into the depression 36. Namely, the tip end of each sprout-shaped metal bump 26 is surrounded by the cone-like protective resin material 38 integrally swelled from the adhesive rein layer 32. Accordingly, since the tip end of each sprout-shaped gold bump 26 is protected from damage and is injury by the protective resin material 38, it is unnecessary to take care in the handling of the FC type semiconductor devices 22'.

Each of the FC type semiconductor devices 22' may be assembled in a BGA (ball grid array) type package including a wiring-board, usually called a package board or interposer, and otherwise may be directly mounted on a motherboard for a piece of electronic equipment. In either case, each of the FC type semiconductor devices 22' is mounted on and bonded to the wiring-board or the motherboard, using either a well-known ultrasonic-pressure bonding method or a well-known heat-pressure bonding method.

When the ultrasonic-pressure bonding method is used, the FC type semiconductor devices 22' are put in a suitable oven, and are heated such that the amount of the solvent component contained in the adhesive resin layer 32 is reduced from 7 W % to 2~3 W % (TE3). On the other hand, when the heat-pressure bonding method is used, the amount of the solvent component contained in the adhesive resin layer 32 is reduced from 7 W % to 0.5 W % (TE4). Namely, by controlling the amount of the solvent component contained in the adhesive resin layer 32, it is possible to freely select either the ultrasonic-pressure bonding method or the heat-pressure bonding method.

Referring to FIGS. 8A, 8B, and 8C, representative stages of a process for mounting each of the FC type semiconductor devices 22' on a wiring-board is conceptually illustrated. In these drawings, the wiring-board is generally indicated by reference 40, and is used in a BGA type package. As shown in the drawings, the wiring-board 40 includes a superficial circuit pattern layer 42 formed on an upper surface thereof, and a plurality of electrodes pads 44 is formed and arranged on the superficial circuit pattern layer 42. Note that there is a mirror image relationship between the arrangement of electrode pads 24 of the FC type semiconductor device 22' and the arrangement of electrode pads 44 of the wiring-board 40.

Although not illustrated, an ultrasonic-pressure bonding machine is used when the FC type semiconductor device 22' is mounted on the wiring-board 40 by the ultrasonic-pressure bonding method. This machine includes a pedestal on which the wiring-board 40 is rested and fixed, and a movable pressurizing-heating tool in which a sucker for detachably holding the FC type semiconductor device 22' is incorporated.

In the ultrasonic-pressure bonding method, the wiring-board 40 is rested and fixed on the pedestal, which is heated to a suitable temperature within a range from about 30° C. to about 100° C. Then, the FC type semiconductor device 22' is sucked by the pressurizing-heating tool, and is moved to a position above the wiring-board 40, and is lowered to the wiring-board 40 such that such that the electrode pads 24 of the FC type semiconductor device 22' are electrically contacted with the electrode pads 44 of the wiring-board 40 through the intermediary of the sprout-shaped bumps 26, as shown in FIG. 8A. At this time, the FC type semiconductor device 22' is heated by the pressurizing-heating tool to at least 200° C. corresponding to the fluidifying temperature of the adhesive resin layer 32 containing the 2~3 W % solvent component (TE3).

Subsequently, the FC type semiconductor device 22' is pressurized against the wiring-board 40 by driving the pressurizing-heating tool, such that the tip ends of the sprout-shaped bumps 26 are partially squashed, as shown in FIG. 8B. Then, the FC type semiconductor device 22' is further pressurized against the wiring-board 40 while exerting an ultrasonic vibration on the semiconductor device 22' through the pressurizing-heating tool, such that the tip ends of the sprout-shaped bumps 26 are completely squashed, and that the adhesive resin layer 32 is contacted with the upper surface of the wiring-board 40, as shown in FIG. 8C. Namely, the gold bumps 26 are welded and bonded to the electrode pads 44 on the wiring-board 40, and the adhesive resin layer 32 is adhered to the wiring-board 40, resulting in completion of the mounting of the FC type semiconductor device 22' on the wiring-board 40.

According to the ultrasonic-pressure bonding method, since the heating temperature of the adhesive resin layer 32 can be kept below the boiling point of 216° C. of the solvent component (triethylene glycol dimethylether), it is possible to achieve the adhesion of the adhesive resin layer 32 to the wiring-board 40 without production of voids in the adhesive resin layer 32. Namely, the arrangement of gold bumps 26 can be satisfactorily sealed by the adhesive resin layer 32. Further, since the adhesive resin layer 32 containing the 2~3 W % solvent component (TE3) exhibits a temperate softness while being heated, the gold bumps 26 can be sufficiently subjected to the ultrasonic vibration, whereby the bonding of the gold bumps 26 to the electrode pads 44 can be surely and securely achieved.

Also, although not illustrated, a heat-pressure bonding machine is used when each of the FC type semiconductor devices 22' is mounted on the wiring-board 40 by the heat-pressure bonding method. This machine also includes a pedestal on which the wiring-board 40 is rested and fixed, and a movable pressurizing-heating tool in which a sucker for detachably holding the semiconductor device 22' is incorporated.

Similar to the ultrasonic-pressure bonding is method, in the heat-pressure bonding method, the wiring-board 40 is rested and fixed on the pedestal, which is heated to a suitable temperature within a range from about 30° C. to about 100° C. Then, the FC type semiconductor device 22' is sucked by the pressurizing-heating tool, and is moved to a position above the wiring-board 40, and is lowered to the wiring-board 40 such that such that the electrode pads 24 of the semiconductor device 22' are electrically contacted with the electrode pads 44 of the wiring-board 40 through the intermediary of the sprout-shaped bumps 26, as shown in FIG. 8A. At this time, the FC type semiconductor device 22' is heated by the pressurizing-heating tool to at least 260° C. corresponding to the fluidifying temperature of the adhesive resin layer 32 containing the 0.5 W % solvent component (TE4).

Subsequently, the FC type semiconductor device 22' is pressurized against the wiring-board 40 by driving by the pressurizing-heating tool while being heated, such that the tip ends of the sprout-shaped bumps 26 are completely squashed, as shown in FIGS. 8B and 8C, whereby the gold bumps 26 are securely bonded to the electrode pads 44 on the wiring-board 40. Namely, the gold bumps 26 are bonded to the electrode pads 44 on the wiring-board 40, and the adhesive resin layer 32 is adhered to the wiring-board 40, resulting in completion of the mounting of the FC type semiconductor device 22' on the wiring-board 40.

According to the heat-pressure bonding method, although the adhesive resin layer 32 is heated to more than the boiling point of 216° C. of the solvent component (triethylene glycol dimethylether), it is possible to prevent production of voids in the adhesive resin layer 32, because the amount of the solvent component contained in the adhesive resin layer 32 is restrained at most 0.5 W %. Accordingly, it is possible to satisfactorily seal the arrangement of gold bumps 26 by the adhesive resin layer 32.

After each of the above-mentioned mounting processes is finished, although the solvent component is gradually evaporated from the adhesive resin layer 32, it is possible to subject the mounted semiconductor devices 22' to a heating process to positively perform the evaporation of the solvent component from the adhesive resin layer 32. When the solvent component is almost evaporated from the adhesive resin layer 32, the fluidifying temperature of the adhesive resin layer 32 becomes more than 360° C., as is apparent from the graph of FIG. 6. This is significant when the FC type semiconductor device 22' is assembled in a BGA (ball grid array) type package.

In particular, as stated above, the BGA type package has a plurality of metal balls provided on a lower or bottom surface thereof, and are mounted on an arrangement of electrode pads of a motherboard by heating the metal balls under a pressure. When the metal balls are made of solder, the solder balls can be easily bonded on the electrode pads of the motherboard at a temperature less than 360° C. However, when the metal balls are made of another metal, such as tin (Pb), silver (Ag), copper (Cu) or the like, it is necessary to heat the metal balls on the order of 360° C., the metal balls can be sufficiently bonded on the electrode pads of the motherboard without thermally to fluidifying the adhesive resin layer (32) of the BGA type package. In short, according to the aforesaid FC type semiconductor devices 22', the use of the other metals (Pb, Ag, Cu, or the like) except for solder can be allowed for the balls.

As stated above, in the above-mentioned laminating process, the tip end of each sprout-shaped gold bump 26 merely forms the depression 36 in the film-like support element 30 without the film-like support element 30 being pierced by the protruded tip end of each bump 26. Namely, the tip end face of each gold bump 26 is in contact with a bottom face of the depression 36. Accordingly, it is impossible to completely exclude a possibility of introducing the fluidified resin material into the boundary between the tip end face of each sprout-shaped bump 26 and the bottom face of the depression 36.

If the fluidified resin material is introduced into the boundary between the tip end face of each sprout-shaped bump 26 and the bottom face of the depression 36, the tip end face of each sprout-shaped bump 26 is covered with the thin resin film. Although the thin resin film can be easily removed from the tip end faces of the sprout-shaped bumps 26, the existence of the thin resin films is undesirable, because it may exert a bad influence on the bonding of the sprout-shaped bumps 26 to the electrode pad 44 on the wiring-board 40.

Figure 9A:
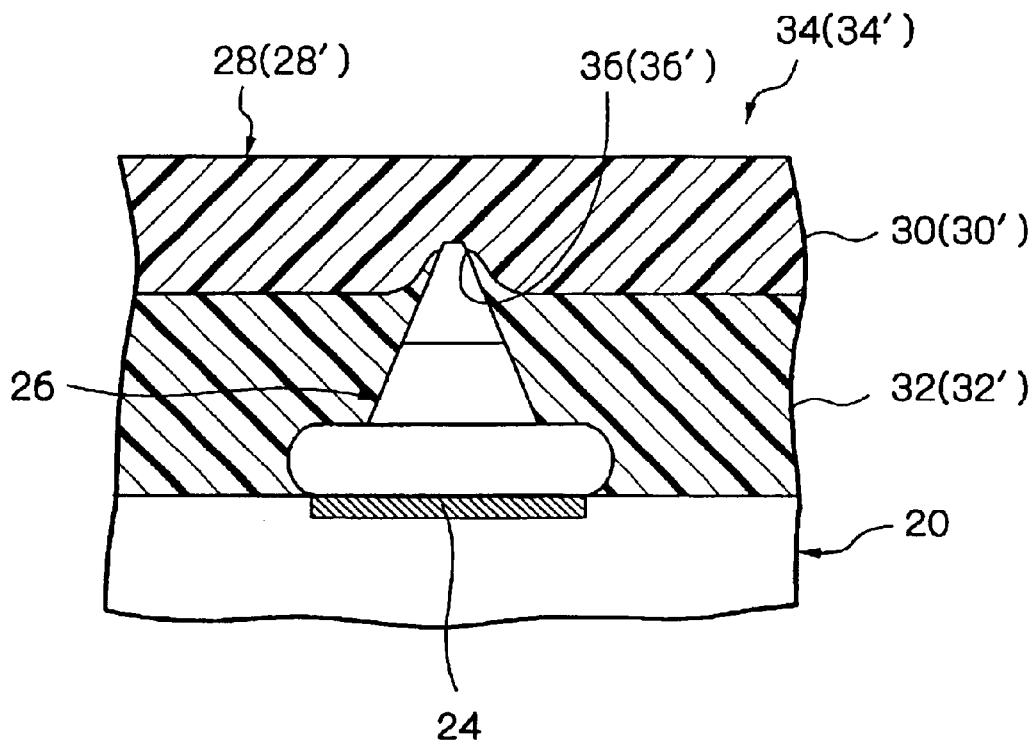
FIG. 9A is an enlarged partial cross-sectional side view, similar to FIG. 7A, in which the film-like support element of the adhesive resin sheet is pierced by a top endmost portion of the sprout-shaped bump.
Figure 9B:
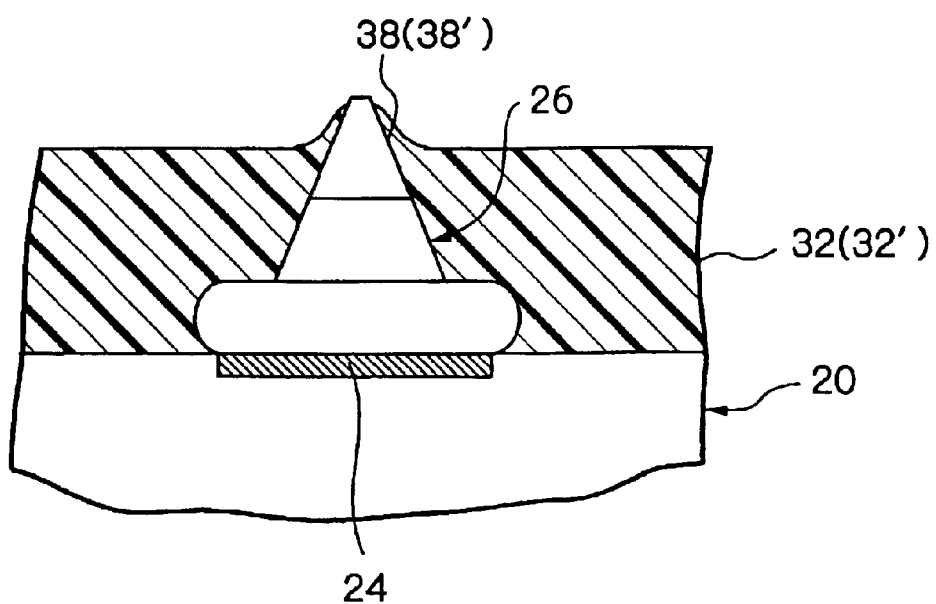
FIG. 9B is an enlarged partial cross-sectional side view, similar to FIG. 7B, in which the top endmost portion of the sprout-shaped bump is exposed to the outside.

In order to prevent the production of the thin resin films, the film-like support element 30 may be pierced by the tip-endmost portion of each sprout-shaped gold bump 26 in the laminating process, as shown in FIG. 9A. The piercing of the film-like support element 30 by the tip-endmost portion of each bump 26 is made possible by exerting the pressure of approximately 1 MPa on the silicone wafer 20 (the FC type semiconductor devices 22') and by heating on the silicon wafer 20 to more than 140° C. Accordingly, when the film-like support element 30 is removed from the assembly 34, as shown in FIG. 9B, the endmost portion of each sprout-shaped gold bump 26 is exposed to the outside.

Figure 10:
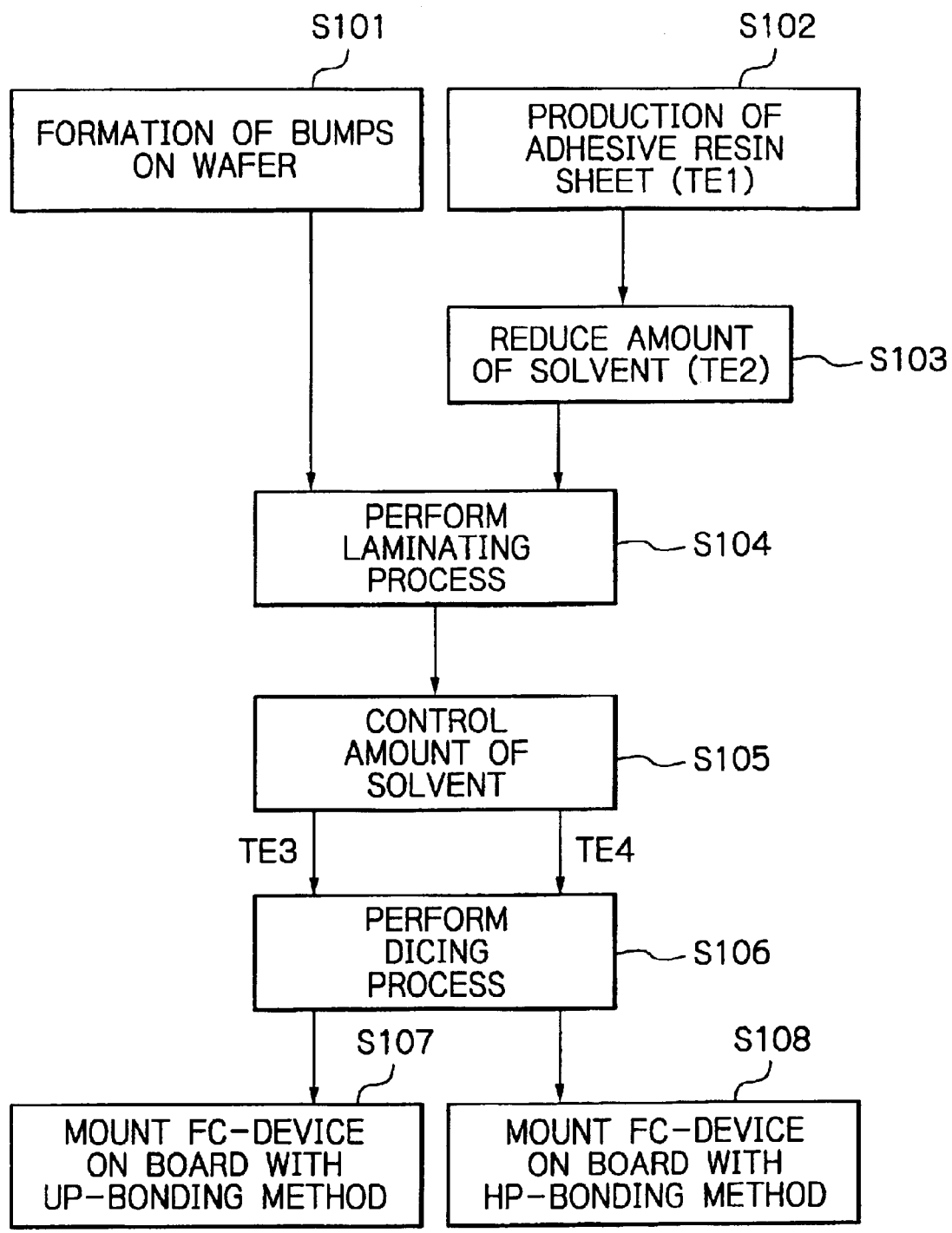
FIG. 10 is a flowchart of the first embodiment of the manufacturing process including the mounting process.

FIG. 10 shows a flowchart of the first embodiment of the manufacturing process including the mounting process.

At step S101, the formation of the sprout-shaped gold bumps 26 on the silicon wafer 20 is performed (FIG. 5A). On the other hand, at step S102, the production of the adhesive resin sheet 28 is performed (FIG. 5B). Note, of course, it is possible to simultaneously perform the steps of formation of the sprout-shaped gold bumps 26 on the silicon wafer 20 and the production of the adhesive resin sheet 28 because they are independent from each other.

At step S103, the reduction of the amount of solvent component in the adhesive resin layer 32 is performed. Namely, the adhesive resin sheet 28 is put in the oven, thereby reducing the amount of solvent component from 20 W % to 7 W % (TE2). Then, at step S104, the laminating process is performed, using the diaphragm type vacuum laminating machine (FIG. 5C), to thereby transfer the adhesive resin layer 32 from the adhesive resin sheet 28 to the silicon wafer 20 having the arrangement of sprout-shaped bumps 26.

At step S105, the silicon wafer 20, carrying the arrangement of sprout-shaped bumps 26 and the adhesive resin layer 32, is put in the oven to thereby control the amount of solvent component in the adhesive resin layer 32. Namely, when each of the FC type semiconductor devices 22' should be mounted on the wiring-board 40, using the ultrasonic-pressure bonding method, the amount of solvent component in the adhesive resin layer 32 is reduced from 7 W % to 2~3 W % (TE3). On the other hand, when each of the FC type semiconductor devices 22' should be mounted on the wiring-board 40, using the heat-pressure bonding method, the amount of solvent component in the adhesive resin layer 32 is reduced from 7 W % to 0.5 W % (TE4).

In either case, at step S106, the dicing process is performed to cut the silicon wafer 20 along the grid-like grooves defining the FC type semiconductor devices 22', to thereby separate the FC type semiconductor devices 22' from each other (fourth stage D in FIG. 4).

When the FC type semiconductor device 22' is featured by the characteristic TE3 (FIG. 6), the mounting of the FC type semiconductor device 22' on the wiring-board 40 is performed by the ultrasonic-pressure bonding method (step S107). Also, when the FC type semiconductor device 22' is featured by the characteristic TE4 (FIG. 6), the mounting of the FC type semiconductor device 22' on the wiring-board 40 is performed by the heat-pressure bonding method (step S108).

Figure 11:
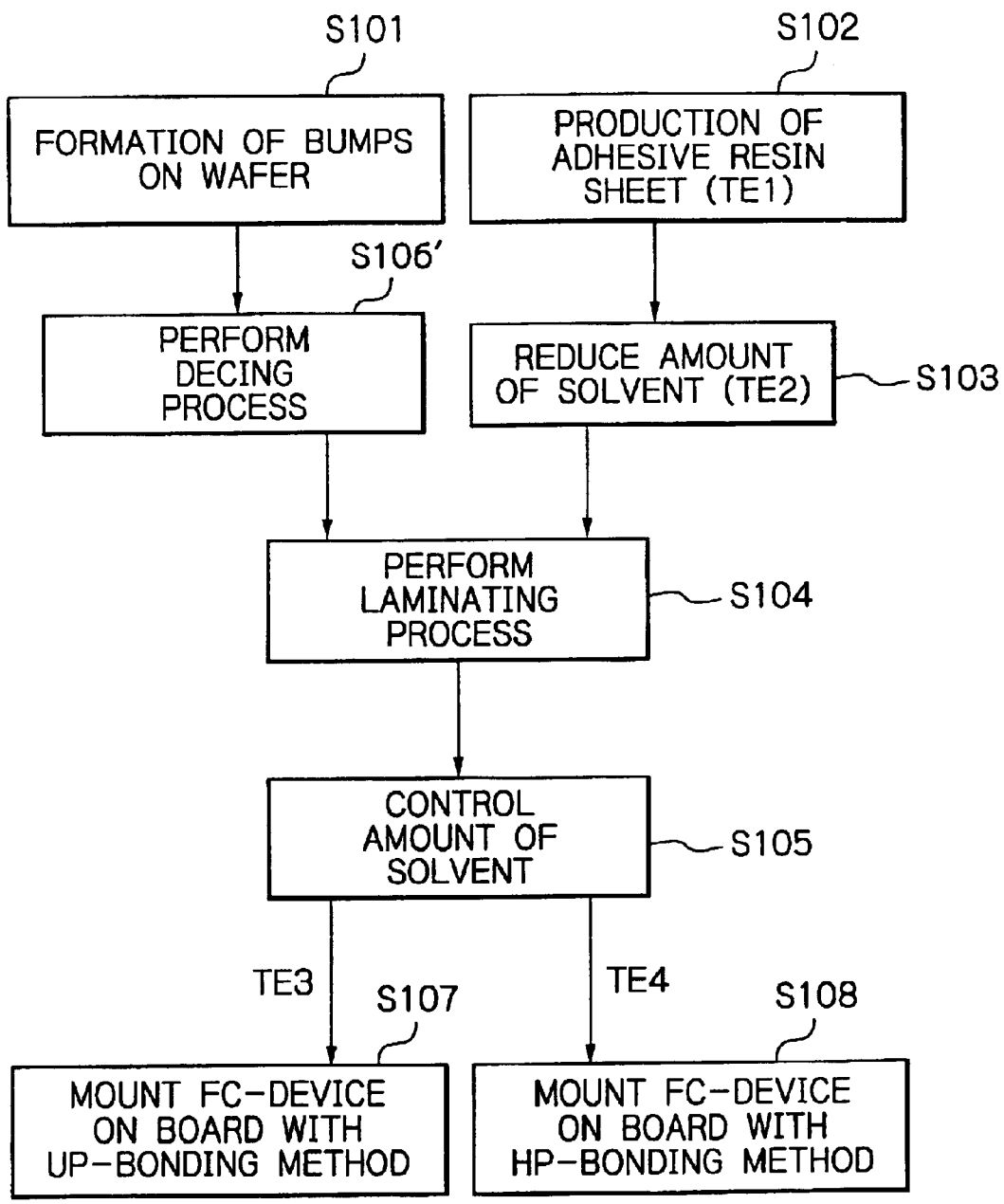
FIG. 11 is a modification of the flowchart of the first embodiment of the manufacturing process including the mounting process.

FIG. 11 shows a modification of the flowchart of the first embodiment of the manufacturing process including the mounting process.

Figure 12:
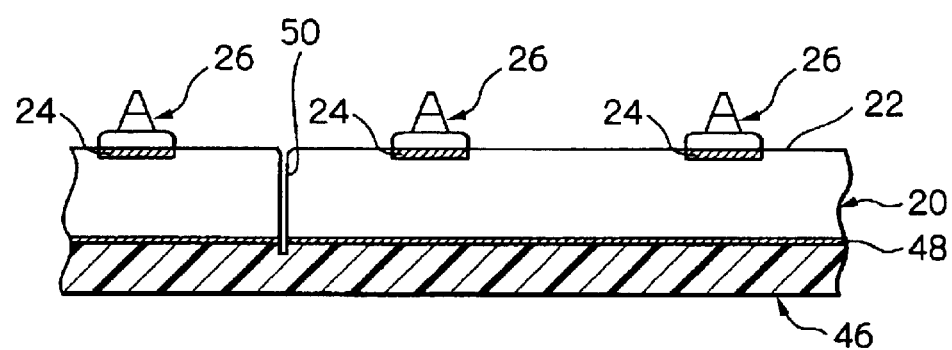
FIG. 12 is a partial cross-sectional side view of the silicon wafer, similar to FIG. 5A, for explaining the modification of the flowchart shown in FIG. 11.

As shown in this modified flow chart, at step S106', the dicing process is performed following the formation of the sprout-shaped bumps 26. In this case, as shown in FIG. 12, a lining resin sheet 46 having an adhesive layer 48 is applied and adhered to the surface of the silicon wafer 20 which is opposite to the surface thereof having the arrangement of sprout-shaped bumps 26. The silicon wafer 20 is cut off and divided into the plurality of FC type semiconductor devices 22', and a cutting groove is representatively indicated by reference 50.

As is apparent from FIG. 12, the silicon wafer 20 is completely cut off, but the lining resin sheet 46 is partially cut as illustrated. Thus, the arrangement of FC type semiconductor devices 22' maintains the configuration of the silicon wafer 20 without being dispersed, and thus it is possible to perform the laminating process at step S104.

Figure 13:
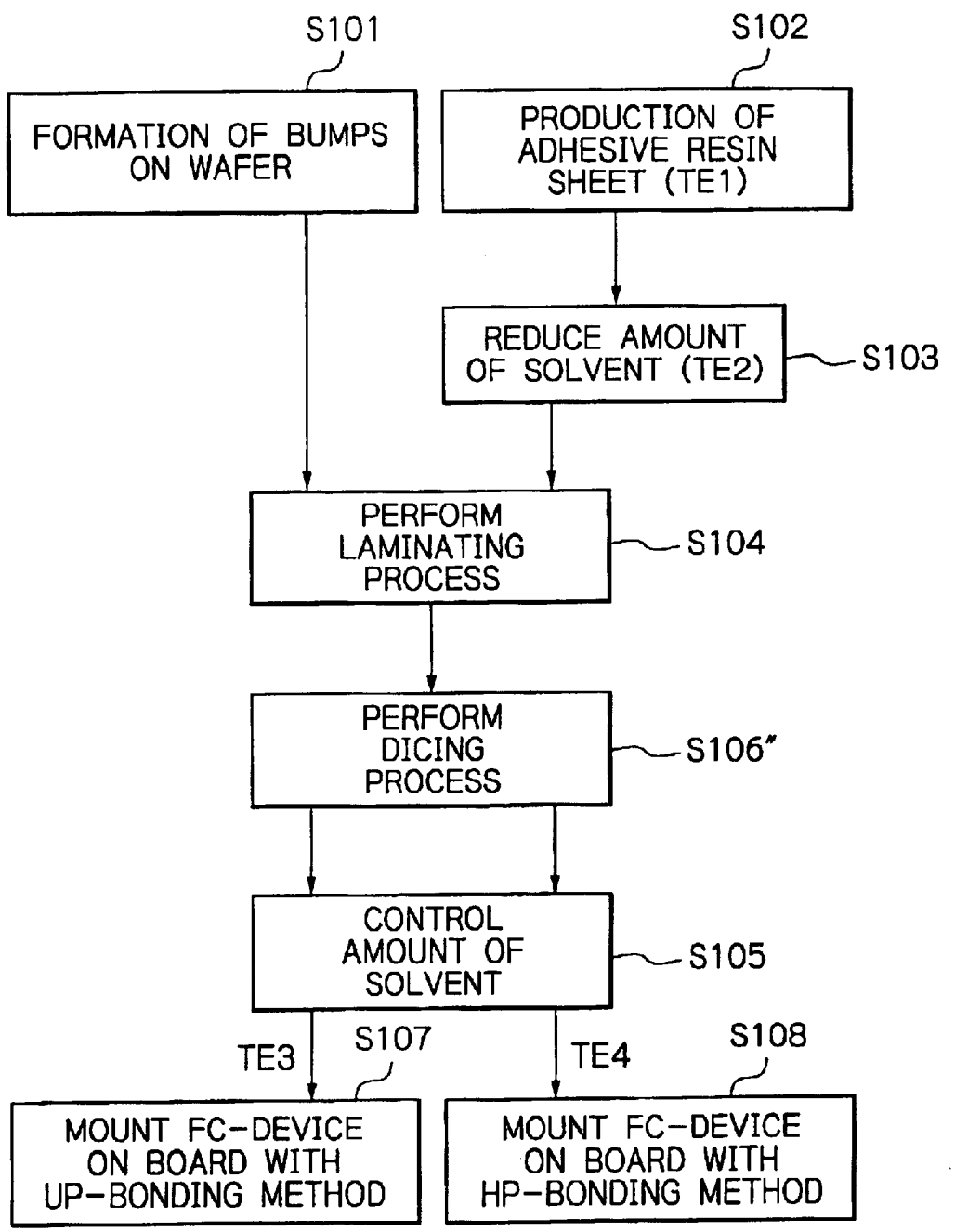
FIG. 13 is another modification of the flowchart of the first embodiment of the manufacturing process including the mounting process.

FIG. 13 shows another modification of the flowchart of the first embodiment of the manufacturing process including the mounting process.

As shown in this modified flow chart, at step S106", the dicing process is performed following the performance of the laminating process, and thus all the divided FC type semiconductor devices 22' are featured by the characteristic TE2. In this case, at step S105, the control of the amount of solvent component in the adhesive resin layer 32 can be individually performed with respect to the divided FC type semiconductor devices 22'.

Figure 14:
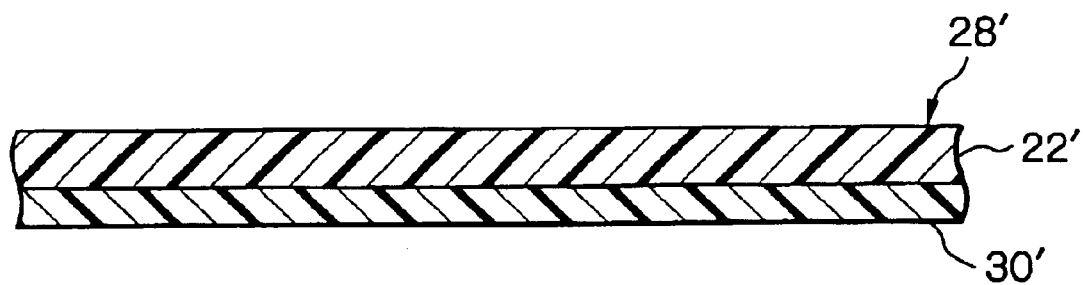
FIG. 14 is a partial cross-sectional side view, similar to FIG. 5B, showing an adhesive hybrid resin sheet used in a second embodiment of the manufacturing process according to the present invention.

With reference to FIG. 14, an adhesive hybrid resin sheet 28' is shown, and is used in a second embodiment of the manufacturing process according to the present invention. Namely, the second embodiment is substantially identical to the first embodiment except that the adhesive hybrid resin sheet 28' is substituted for the adhesive resin sheet 28 shown in FIG. 5B.

The adhesive hybrid resin sheet 28' is constituted from a film-like support element 30' made of a suitable resin, such as polyethylene terephthalate (PET) or the like, and an adhesive hybrid resin layer 32' formed on the film-like support element 30'. The adhesive hybrid resin layer 32' is composed of a suitable thermoplastic resin component, such as polyimide or the like, and a suitable thermosetting resin component, such as epoxy or the like, exhibiting a relatively high glass transition temperature.

With reference to a graph of FIG. 15, a relationship between a temperature (T° C.) of the adhesive hybrid resin layer 32' and an elastic modulus (E) of the adhesive hybrid resin layer 32' is represented by a characteristic TE, and four significant temperatures T1 (100~120° C.), T2 (140° C.), T3 (200° C.), and T4 (300° C.) are defined on the basis of the characteristic TE, as stated in detail hereinafter.

Figure 15:
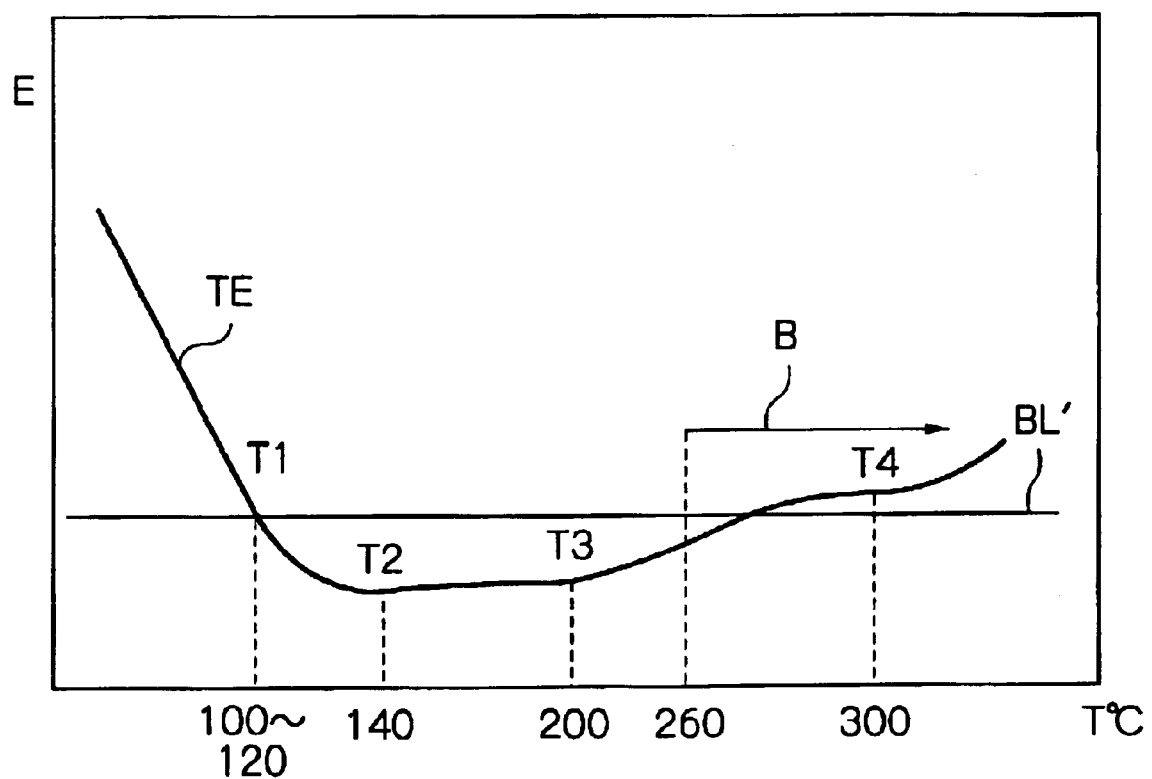
FIG. 15 is a graph showing a relationship between a temperature of an adhesive hybrid resin layer of the adhesive hybrid resin sheet and an elastic modulus of the adhesive hybrid resin layer.

Also, in the graph of FIG. 15, an arrow B represents that a hardening of the thermosetting resin (epoxy) component in the adhesive hybrid resin layer 32' is substantially started at a temperature 260° C. Note, in reality, although the hardening of the epoxy component is started at a temperature which is lower than the temperature of 260° C., the state of the adhesive hybrid resin layer 32' is not almost changed until it is heated to 260° C. Further, in this graph, reference BL' indicates a boundary line representing whether or not the adhesive hybrid resin layer 32' can be fluidified.

Note, in the graph of FIG. 15, although a state of the fluidified hybrid adhesive resin layer 32' should be evaluated by a viscosity of the fluidified adhesive hybrid layer 32', the ordinate of the graph of FIG. 15 represents the elastic modulus (E) for the sake of convenience for the same reasons as stated regarding the graph of FIG. 6.

Figure 16:
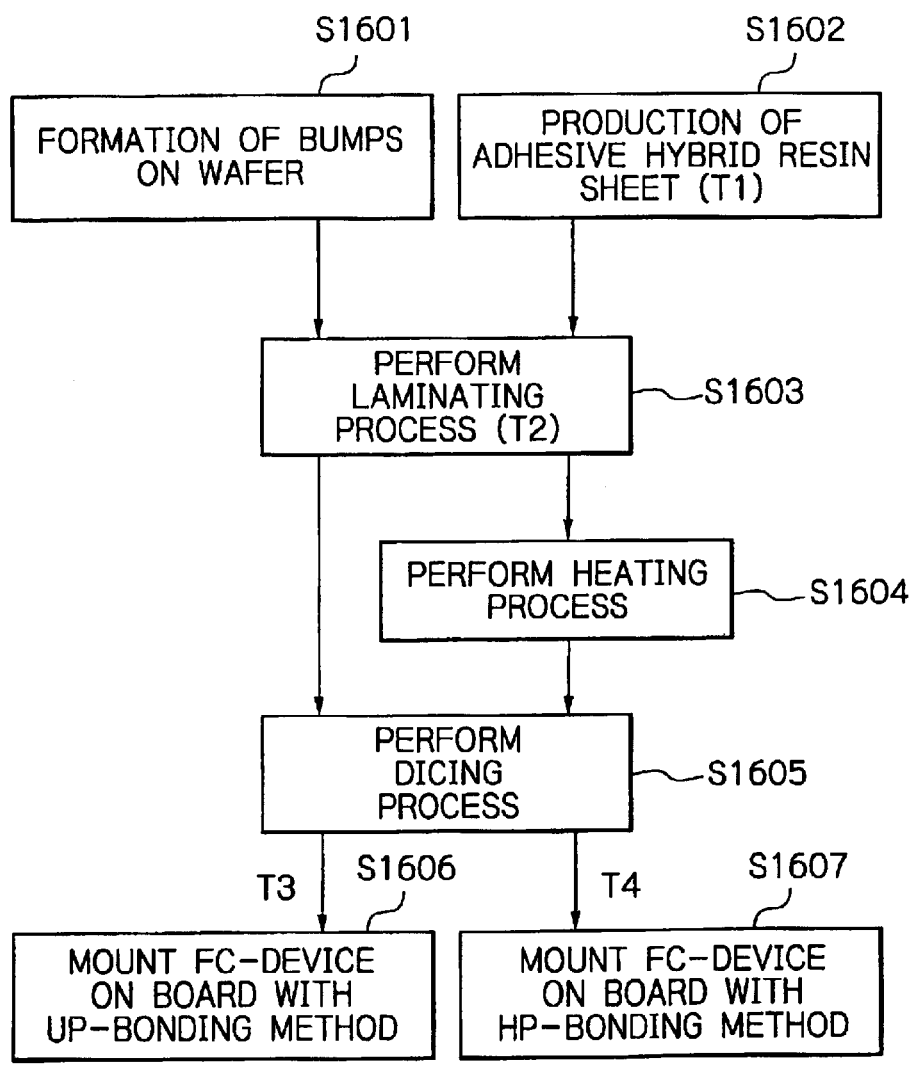
FIG. 16 is a flowchart of the second embodiment of the manufacturing process including a process for mounting a manufactured flip-chip type semiconductor device on a wiring-board.

FIG. 16 shows a flowchart of the second embodiment of the manufacturing process including a process for mounting a manufactured FC type semiconductor device on a wiring-board.

At step S1601, the formation of the sprout-shaped gold bumps 26 on the silicon wafer 20 is performed in substantially the same manner as in the first embodiment, and thus each semiconductor chip area 22 is produced as a flip-chip (FC) type semiconductor device 22' in the silicon wafer 20.

On the other hand, at step S1602, the production of the adhesive hybrid resin sheet 28' is performed (FIG. 14). Namely, the formation of the adhesive hybrid resin layer 32' is performed by coating the film-like support element 30' with a fluid hybrid resin material which is composed of the thermoplastic resin component and the thermosetting resin component, and which is heated to a temperature more than T1 (100~120° C.), and the adhesive hybrid resin layer 32' has a thickness less than a height of the sprout-shaped gold bumps 26.

Note, it is possible to simultaneously perform the formation of the sprout-shaped gold bumps 26 on the silicon wafer 20 and the production of the adhesive hybrid resin sheet 28' because they are independent from each other.

At step S1603, a laminating process is performed to thereby transfer the adhesive hybrid resin layer 32' from the adhesive hybrid resin sheet 28' to the silicon wafer 20 having the arrangement of sprout-shaped bumps 26, using the aforesaid diaphragm type vacuum laminating machine in substantially the same manner as in the first embodiment.

In particular, the adhesive hybrid resin sheet 28' is placed on the silicon wafer 20 such that the surface of the adhesive hybrid resin layer 32' is opposed to the arrangement of sprout-shaped bumps 26 on the silicon wafer 20, resulting in production of a provisional assembly 34' (cf. FIG. 5C). Then, the provisional assembly 34' is sandwiched by a carrier film and a cover film, and is fed to the vacuum chamber of the diaphragm type vacuum laminating machine. The provisional assembly 34' is heated in the vacuum chamber to 140° C. (T2), which is higher than the glass transition temperature (70~90° C.) of the film-like support element (PET).

Subsequently, the vacuum chamber is evacuated such that a pressure within a range from 0.5 to 1.0 MPa is entirely and uniformly exerted on the provisional assembly 34', whereby the silicon wafer 20 and the adhesive hybrid resin sheet 28' are moved so as to be close to each other. Thus, each sprout-shaped bump 26 passes through the adhesive hybrid resin layer 32' such that the tip end of each bump 26 is protruded from the surface of the adhesive hybrid resin layer 32' which is in contact with the film-like support element 30' (cf. FIG. 7A).

As stated above, the thickness of the adhesive hybrid resin layer 32' is less than the height of the sprout-shaped bumps 26, and thus each sprout-shaped gold bump 26 passes through the adhesive hybrid resin layer 32' such that the tip end of each bump 26 is protruded from the surface of the adhesive hybrid resin layer 32' which is in contact with the film-like support element 30'(cf. FIG. 7A). Nevertheless, the protruded tip end of each bump 26 merely forms a depression 36' in the film-like support element 30' without the film-like support element 30' being pierced by the protruded tip end of each bump 26, because the film-like support element 30' is heated to 140° C. (T2) which is grater than the glass transition temperature (70~90° C.) of the polyethylene terephthalate. A part of the resin material forming the adhesive hybrid resin layer 32' is introduced into the depression 36', because the adhesive hybrid resin layer 32' can be fluidified at the temperature 140° C., as is apparent from the graph of FIG. 16.

Thereafter, the assembly 34' is taken out of the diaphragm type vacuum laminating machine, and is put under the ambient temperature such that the adhesive hybrid resin layer 32' cannot be fluidified, i.e. it is solidified. Then, when the film-like support element 30' is removed from the assembly 34', the adhesive hybrid resin layer 32' is left on the silicon wafer 20 (cf. FIG. 7B). In other words, the adhesive hybrid resin layer 32' is transferred from the adhesive hybrid resin sheet 28' to the surface of the silicon wafer 20 on which the sprout-shaped gold bumps 26 are arranged.

Similar to the first embodiment, a circumference of the tip end of each sprout-shaped gold bump 26 is surrounded by a cone-like protective resin material 38' integrally swelled from the adhesive rein layer 30', and thus the tip end of each sprout-shaped gold bump 26 is protected from damage and injury by the protective resin material 38'.

When each of the FC type semiconductor devices 22' should be mounted on either a wiring-board or a motherboard, using the ultrasonic-pressure bonding method, the silicon wafer 20 carrying the arrangement of sprout-shaped bumps 26 and the adhesive hybrid resin layer 32' is directly subjected to a dicing process at step S1605 in substantially the same manner as in the first embodiment.

When each of the FC type semiconductor device 22' is mounted on either the wiring-board or the motherboard by the heat-pressure bonding method, the silicon wafer 20 carrying the arrangement of sprout-shaped bumps 26 and the adhesive hybrid resin layer 32' is put in a suitable oven, and is subjected to a heating process at step S1604. Namely, in the heating process, the silicon wafer 20 is heated to 300° C. (T4), thereby thermally setting the thermosetting resin component in the adhesive hybrid resin layer 32', resulting in gelling of the adhesive hybrid resin layer 32'. Then, the silicon wafer 20 carrying the arrangement of sprout-shaped bumps 26 and the adhesive hybrid resin layer 32' is subjected to a dicing process at step S1605 in substantially the same manner as in the first embodiment, whereby the silicon wafer 20 is cut off and divided into the plurality of FC type semiconductor devices 22'.

On the other hand, when each of the FC type semiconductor devices 22' is mounted on either a wiring-board or a motherboard by the ultrasonic-pressure bonding method, the silicon wafer 20 carrying the arrangement of sprout-shaped bumps 26 and the adhesive hybrid resin layer 32' is directly subjected to a dicing process at step S1605, whereby the silicon wafer 20 is cut off and divided into the plurality of FC type semiconductor devices 22'.

At step S1606, an FC type semiconductor device 22', which is not subjected to the heating process at step S1604 is mounted on, for example, a wiring-board 40' by the ultrasonic-pressure bonding machine in substantially the same manner as in the first embodiment (cf. FIGS. 8A to 8C).

In particular, the wiring-board 40' is rested and fixed on the pedestal of the machine, which is heated to a suitable temperature within a range from about 30° C. to about 100° C. Then, the FC type semiconductor device 22' is sucked by the pressurizing-heating tool of the machine, and is moved to a position above the wiring-board 40', and is lowered to the wiring-board 40' such that such that the electrode pads 24 of the semiconductor device 22' are electrically contacted with electrode pads 44' of the wiring-board 40' through the intermediary of the sprout-shaped bumps 26 (cf. FIG. 8A). At this time, the FC type semiconductor device 22' is heated by the pressurizing-heating tool to a relatively-low temperature within a range between the temperature of 140° C. (T2) and the temperatures of 200° C. (T3) in which the adhesive hybrid resin layer 32' can be fluidified.

Subsequently, the FC type semiconductor device 22' is pressurized against the wiring-board 40 by driving the pressurizing-heating tool, such that the tip ends of the sprout-shaped bumps 26 are partially squashed (cf. FIG. 8B). Then, the FC type semiconductor device 22' is further pressurized against the wiring-board 40' while exerting an ultrasonic vibration on the FC type semiconductor device 22' through the pressurizing-heating tool, such that the tip ends of the sprout-shaped bumps 26 are completely squashed, and that the adhesive hybrid resin layer 32' is contacted with the upper surface of the wiring-board 40' (cf. FIG. 8C). Namely, the gold bumps 26 are welded and bonded to the electrode pads 44' on the wiring-board 40', and the adhesive hybrid resin layer 32' is adhered to the wiring-board 40', resulting in completion of the mounting of the FC type semiconductor device 22' on the wiring-board 40'.

According to the ultrasonic-pressure bonding method, since the heating temperature of the adhesive hybrid resin layer 32' is relatively low, it is possible to achieve the adhesion of the adhesive hybrid resin layer 32' to the wiring-board 40' without production of voids in the adhesive resin hybrid layer 32'. Namely, the arrangement of gold bumps 26 can be satisfactorily sealed by the adhesive resin hybrid layer 32'. Further, since the adhesive hybrid resin layer 32' exhibits a temperate softness while being heated, the gold bumps 26 can be sufficiently subjected to the ultrasonic vibration, whereby the bonding of the gold bumps 26 to the electrode pads 44' can be surely and securely achieved.

At step S1607, an FC type semiconductor device 22', which is subjected to the heating process at step S1604 is mounted, for example, on a wiring-board 40' by the heat-pressure bonding machine in substantially the same manner as in the first embodiment (cf. FIGS. 8A to 8C).

Similar to the ultrasonic-pressure bonding method, in the heat-pressure bonding method, the wiring-board 40' is rested and fixed on the pedestal, which is heated to a suitable temperature within a range from about 30° C. to about 100° C. Then, the FC type semiconductor device 22' is sucked by the pressurizing-heating tool, and is moved to a position above the wiring-board 40', and is lowered to the wiring-board 40' such that the electrode pads 24 of the semiconductor device 22' are electrically contacted with electrode pads 44' of the wiring-board 40' through the intermediary of the sprout-shaped bumps 26 (cf. FIG. 8A). At this time, the FC type semiconductor device 22' is heated by the pressurizing-heating tool to approximately 300° C. (T4) at which the adhesive hybrid resin layer 32' is gelled.

Subsequently, the FC type semiconductor device 22' is pressurized against the wiring-board 40' by driving by the pressurizing-heating tool while being heated, such that the tip ends of the sprout-shaped bumps 26 are completely squashed (cf. FIGS. 8B and 8C), whereby the gold bumps 26 are securely bonded to the electrode pads 44' on the wiring-board 40'. Namely, the gold bumps 26 are bonded to the electrode pads 44' on the wiring-board 40', and the adhesive hybrid resin layer 32' is adhered to the wiring-board 40', resulting in completion of the mounting of the semiconductor device 22' on the wiring-board 40'.

According to the heat-pressure bonding method, although the heating temperature of the adhesive hybrid resin layer 32' is relatively high, it is possible to prevent production of voids in the adhesive hybrid resin layer 32' due to the gelling state thereof. Accordingly, it is possible to satisfactorily seal the arrangement of gold bumps 26 by the adhesive hybrid resin layer 32'.

Similar to the first embodiment, the film-like support element 30' may be pierced by the tip-endmost portion of each sprout-shaped gold bump 26 in the laminating process (S1603) of the second embodiment (Cf. FIG. 9A). Namely, the piercing of the film-like support element 30' by the tip-endmost portion of each bump 26 is made possible by exerting the pressure of 1 MPa on the FC type semiconductor device 22' and by heating the FC type semiconductor device 22' to more than 140° C. Accordingly, when the film-like support element 30' is removed from the assembly 34', the endmost portion of each sprout-shaped gold bump 26 is exposed to the outside (Cf. FIG. 9B).

Figure 17:
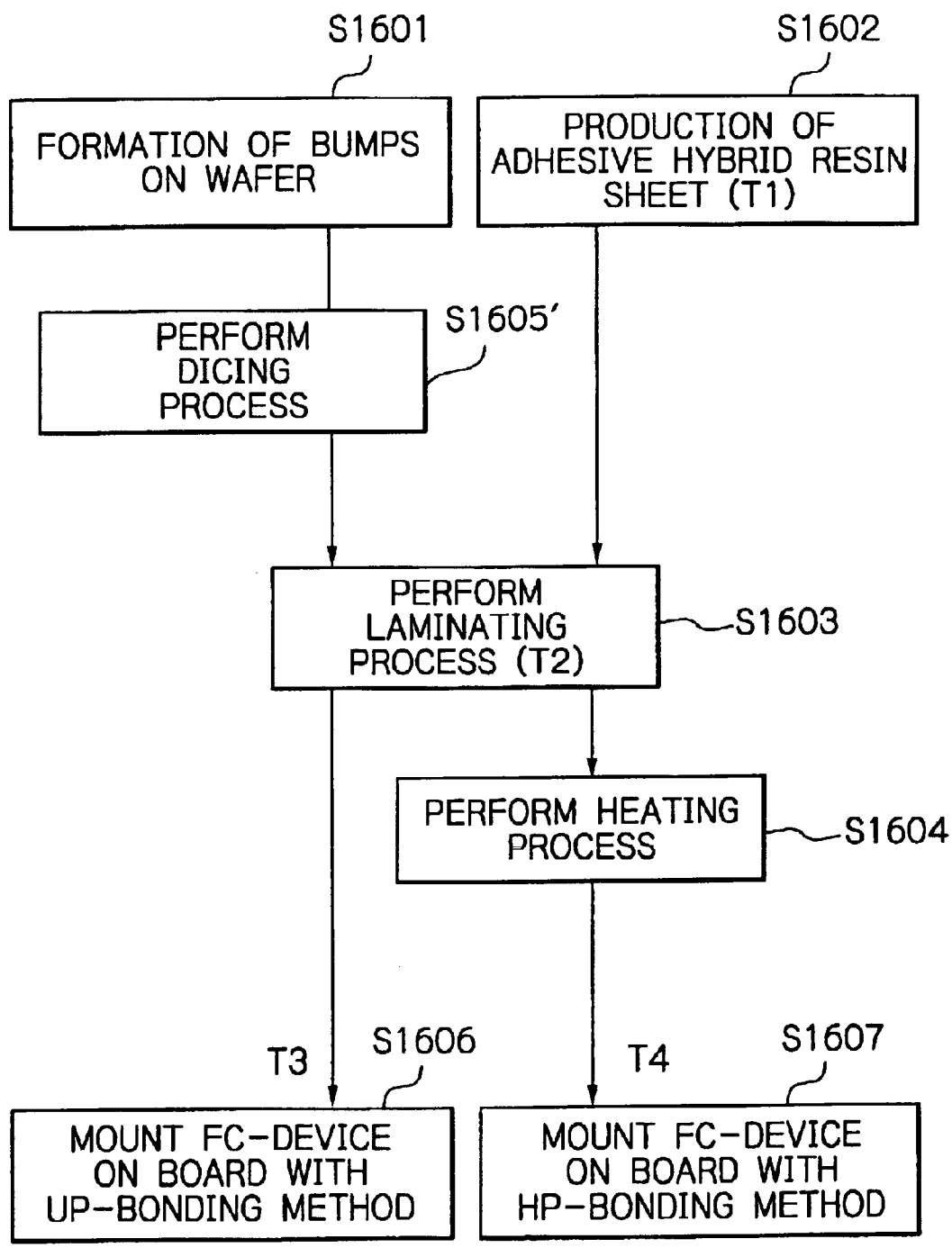
FIG. 17 is a modification of the flowchart of the second embodiment of the manufacturing process including the mounting process.

FIG. 17 shows a modification of the flowchart of the second embodiment of the manufacturing process including the mounting process. As shown in this modified flow chart, at step S1605', the dicing process is performed following the formation of the sprout-shaped bumps 26. Of course, in this case, as shown in FIG. 12, the lining resin sheet 46 having the adhesive layer 48 is applied and adhered to the surface of the silicon wafer 20 which is opposite to the surface thereof having the arrangement of sprout-shaped bumps 26, for the same reasons as explained regarding FIG. 12.

Figure 18:
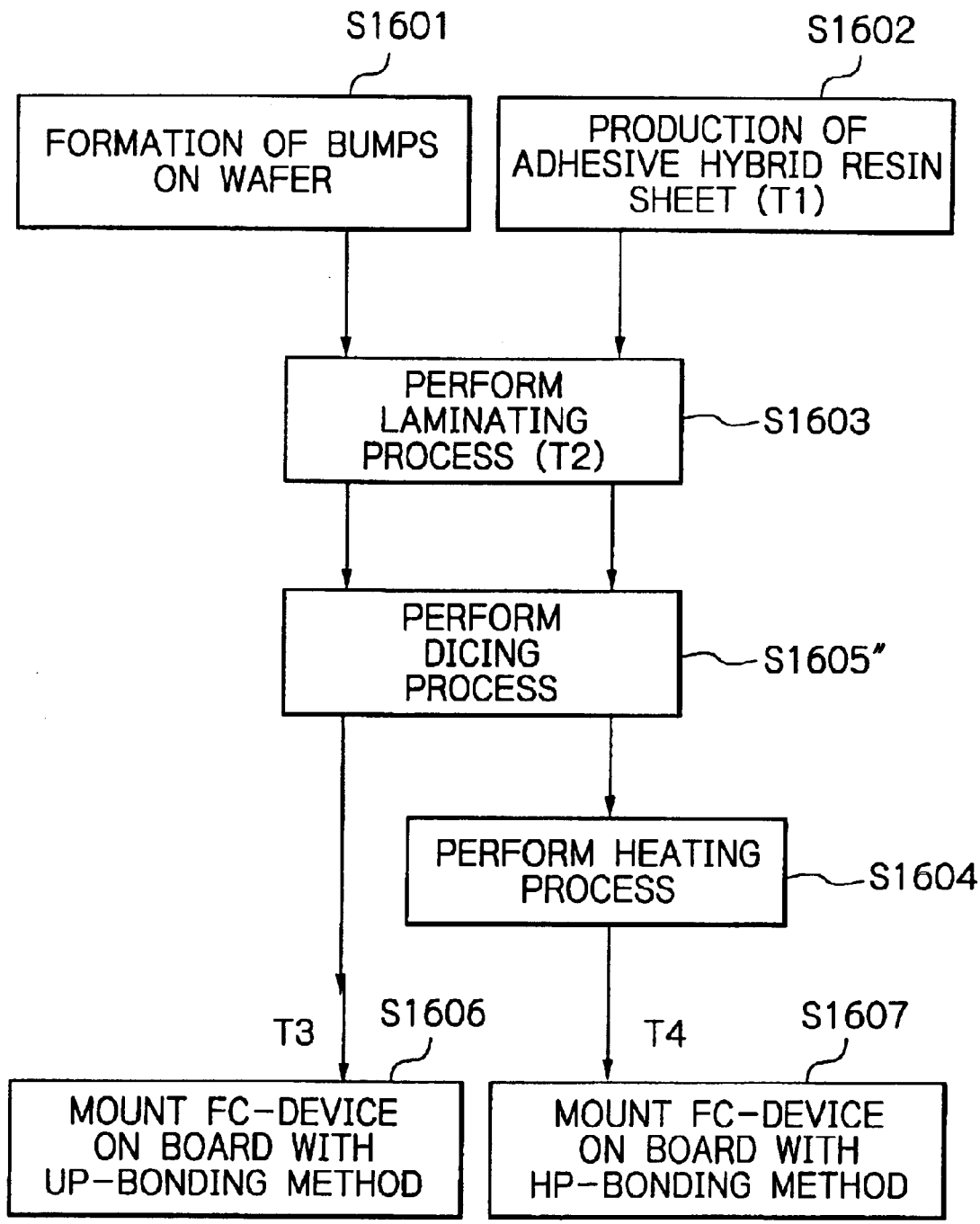
FIG. 18 is another modification of the flowchart of the second embodiment of the manufacturing process including the mounting process.

FIG. 18 shows another modification of the flowchart of the second embodiment of the manufacturing process including the mounting process. As shown in this modified flow chart, at step S106", the dicing process is performed following the performance of the laminating process. Of course, in this case, some of all the divided FC type semiconductor devices 22' is subjected to the heating process at step S1604 only when being mounted on the wiring-board 40' by the heat-pressure bonding method.

Figure 19:
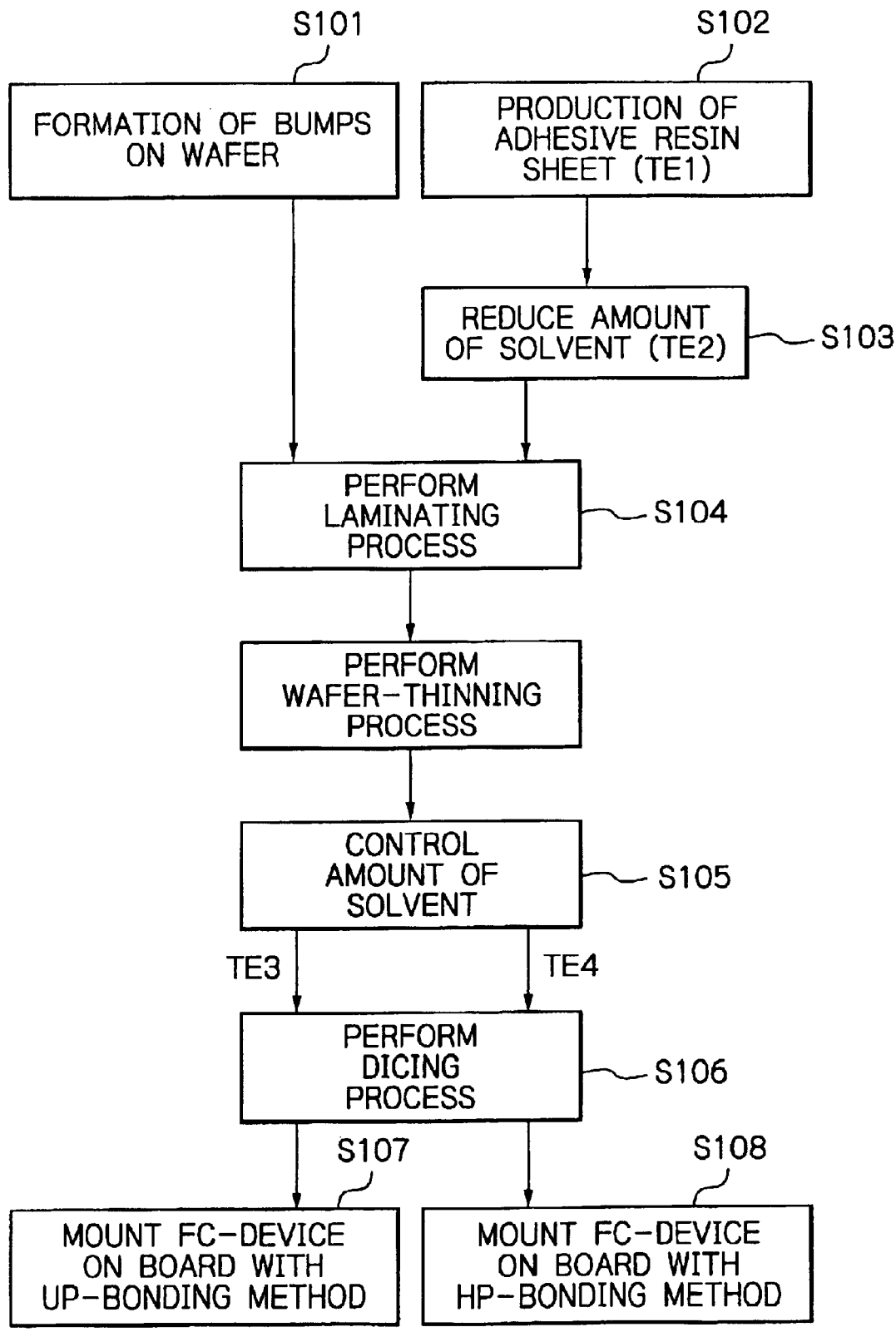
FIG. 19 is a flowchart of a third embodiment of the manufacturing process, including the mounting process, according to the present invention.

FIG. 19 shows a flowchart of a third embodiment of the manufacturing process, including the mounting process, according to the present invention. This flowchart is substantially identical to the flowchart of the aforesaid first embodiment except that step S109 is added after step S104.

Figure 20A:
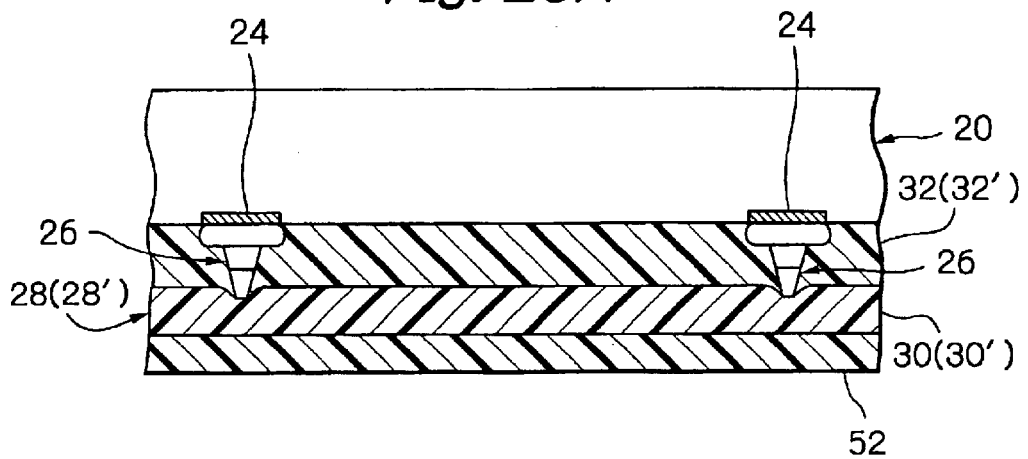
FIG. 20A is a partial cross-sectional side view of a silicon wafer having the arrangement of sprout-shaped bumps, an adhesive resin layer sheet, and a supporting sheet, which is subjected to a wafer-thinning process in the third embodiment of the manufacturing process shown in FIG. 19.

In particular, at step S109, a wafer-thinning process for thinning a thickness of the silicon wafer 20 is performed following the laminating process (S104). In the wafer-thinning process, as shown in FIG. 20A, a supporting resin sheet 52 is adhered to the film-like support element with a suitable adhesive agent, and is made of a suitable resin, such as polyolefin or the like.

Figure 20B:
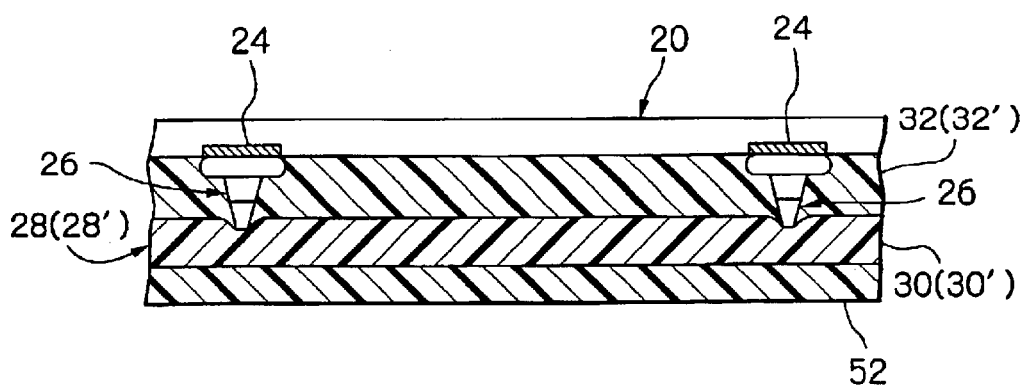
FIG. 20B is a partial cross-sectional side view, similar to FIG. 20A, showing the silicon wafer subjected to the wafer-thinning process.
Figure 20C:
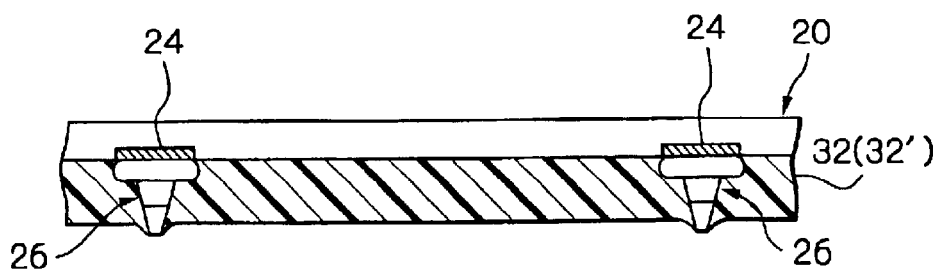
FIG. 20C is a partial cross-sectional side view, similar to FIG. 20B, showing the silicon wafer to which an adhesive resin layer of the adhesive resin layer sheet is transferred.

Then, the silicon wafer 20 is thinned by either physically polishing or chemically etching the rear surface thereof, resulting in the thinning of the thickness of the silicon wafer 20, as shown in FIG. 20B. Thereafter, the film-like support element 30 is removed from the thinned silicon wafer 20, together with the supporting resin sheet 52, as shown in FIG. 20C.

During either the polishing process or the etching process, it is possible to effectively prevent a relative movement between the silicon wafer 20 and the adhesive resin layer 32, because the adhesive resin layer 32 becomes harder due to either the polishing process or the etching process being performed at a relatively-low temperature, and because the tip ends of the sprout-shaped bumps 26 are in mechanical engagement with the adhesive resin layer 32. Accordingly, the thinning of the silicon wafer 20 can be successfully performed.

When the wafer-thinning process is introduced into the manufacturing process, it is preferable to pierce the film-like support element 30 by the tip-endmost portions of the sprout-shaped bump 26 (cf. FIG. 9A), because the firmer mechanical engagement can be ensured between the sprout-shaped bumps 26 and the adhesive resin layer 32.

Note, in the wafer-thinning process, although the use of the supporting resin sheet 52 is preferable, the supporting resin sheet 52 may be omitted if the film-like support element 30 has a sufficient thickness.

FIG. 21 shows a flowchart of a fourth embodiment of the manufacturing process, including the mounting process, according to the present invention. This flowchart is substantially identical to the flowchart of the aforesaid second embodiment except that step S1608 is added after step S1603. At step S1608, a wafer-thinning process for thinning a thickness of the silicon wafer 20 is performed following the laminating process (S1603) in substantially the same manner as mentioned above.

In the aforesaid various embodiments, although gold is used for the sprout-shaped bumps, these bumps may be made of another metal, such as solder, silver or the like. It is possible to form the sprout-shaped bumps from a fine solder wire, using the wire-bonding machine. However, the formation of the sprout-shaped bumps from silver cannot be performed by the wire-bonding machine. In this case, the sprout-shaped bumps are previously formed from silver, and are bonded all at once to the electrode pads on the silicon wafer, using a bump bonding machine which is well known in this field.

Finally, it will be understood by those skilled in the art that the foregoing description is of preferred embodiments of the processes and device, and that various changes and modifications may be made to the present invention without departing from the spirit and scope thereof.

What is claimed is:

1. A flip-chip type semiconductor device comprising:
   a semiconductor chip having a plurality of electrode pads formed and arranged on a chip surface thereof;
   a plurality of sprout-shaped metal bumps bonded to the electrode pads of said semiconductor chip; and
   an adhesive resin layer formed on the chip surface of said semiconductor chip such that tip ends of said sprout-shaped metal bumps are protruded from said adhesive resin layer,
   wherein a circumference of the tip end of each sprout-shaped metal bump is surrounded by a protective resin material integrally swelled from said adhesive resin layer such that at least a substantially flat tip end face of each sprout-shaped metal bump is exposed to an outside.

2. A flip-chip type semiconductor device as set forth in claim 1, wherein said protective resin material is configured such that a tip-endmost portion of each sprout-shaped metal bump is exposed to the outside.

3. A flip-chip type semiconductor device as set forth in claim 1, wherein said sprout-shaped metal bumps are made of a metal material selected from a group consisting of gold, solder, and silver.

4. A flip-chip type semiconductor device as set forth in claim 1, wherein said adhesive resin layer is composed of a thermoplastic resin component and a solvent component, whereby a state of said adhesive resin layer is controlled by regulating an amount of the solvent component and a temperature, such that said semiconductor device may be properly mounted on an electronic board.

5. A flip-chip type semiconductor device as set forth in claim 1, wherein said adhesive resin layer is formed of a hybrid resin composed of a thermoplastic resin component and a thermosetting resin component, whereby a state of said adhesive resin layer is controlled by regulating a temperature and a setting degree of the thermosetting resin component, such that said semiconductor device may be properly mounted on an electronic board.

6. A flip-chip type semiconductor device comprising:

a semiconductor chip having a plurality of electrode pads formed and arranged on a chip surface thereof;

a plurality of sprout-shaped metal bumps bonded to the electrode pads of said semiconductor chip; and an adhesive resin layer formed on the chip surface of said semiconductor chip such that tip ends of said sprout-shaped metal bumps are protruded from said adhesive resin layer, wherein a circumference of the tip end of each sprout-shaped metal bump is surrounded by a protective resin material integrally swelled from said adhesive resin layer such that at least a substantially flat tip end face of each sprout-shaped metal bump is exposed to an outside, wherein said adhesive resin layer is composed of a thermoplastic resin component and a solvent component, whereby a state of said adhesive resin layer is controlled by regulating an amount of the solvent component and a temperature, said adhesive resin layer exhibiting fluidity when it is heated to a temperature of more than 200° C.

7. A flip-chip type semiconductor device comprising:

a semiconductor chip having a plurality of electrode pads formed and arranged on a chip surface thereof;

a plurality of sprout-shaped metal bumps bonded to the electrode pads of said semiconductor chip; and an adhesive resin layer formed on the chip surface of said semiconductor chip such that tip ends of said sprout-shaped metal bumps are protruded from said adhesive resin layer, wherein a circumference of the tip end of each sprout-shaped metal bump is surrounded by a protective resin material integrally swelled from said adhesive resin layer such that at least a substantially flat tip end face of each sprout-shaped metal bump is exposed to an outside, wherein said adhesive resin layer is formed of a hybrid resin composed of a thermoplastic resin component and a thermosetting resin component, whereby a state of said adhesive resin layer is controlled by regulating a temperature and a setting degree of the thermosetting resin component, said adhesive resin layer exhibiting fluidity when it is heated to the temperature falling within a range from 120° C. to 200° C., said adhesive resin layer begins to substantially harden when it is heated to a temperature of at least 260° C.

* * * * *